United States Patent
Kimura et al.

(10) Patent No.: US 8,909,010 B2
(45) Date of Patent: Dec. 9, 2014

(54) OPTICAL COUPLING STRUCTURE AND OPTICAL TRANSRECEIVER MODULE

(75) Inventors: Naoki Kimura, Sakura (JP); Masato Takigahira, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 56 days.

(21) Appl. No.: 13/542,241

(22) Filed: Jul. 5, 2012

(65) Prior Publication Data

US 2012/0275747 A1 Nov. 1, 2012

Related U.S. Application Data

(63) Continuation of application No. PCT/JP2011/050076, filed on Jan. 6, 2011.

(30) Foreign Application Priority Data

Jan. 6, 2010 (JP) .................................. 2010-001100

(51) Int. Cl.
  *G02B 6/30* (2006.01)
  *H01S 5/022* (2006.01)
  *G02B 6/42* (2006.01)
  *H01S 5/40* (2006.01)

(52) U.S. Cl.
  CPC .......... *H01S 5/02284* (2013.01); *G02B 6/4214* (2013.01); *G02B 6/4239* (2013.01); *G02B 6/422* (2013.01); *H01S 5/0226* (2013.01); *H01S 5/02276* (2013.01); *H01S 5/02292* (2013.01); *H01S 5/4025* (2013.01)
  USPC .................................. 385/49; 385/88; 385/94

(58) Field of Classification Search
  CPC .. G02B 6/4212; G02B 6/4214; G02B 6/4239; G02B 6/424; H01S 5/02228; H01S 5/0226; H01S 5/02284; H01S 5/02292

USPC ................................................. 385/49, 88–94
  See application file for complete search history.

(56) References Cited

U.S. PATENT DOCUMENTS 6,019,523 A * 2/2000 Honmou ......................... 385/94
6,170,996 B1 * 1/2001 Miura et al. .................... 385/94
(Continued)

FOREIGN PATENT DOCUMENTS

JP   57-058114 A   4/1982
JP   09-197196 A   7/1997
(Continued)

OTHER PUBLICATIONS

Office Action issued by the Japanese Patent Office in Japanese Application No. 2011-549015 dated Jan. 8, 2013.

*Primary Examiner* — Daniel Petkovsek
(74) *Attorney, Agent, or Firm* — Sughrue Mion, PLLC

(57) ABSTRACT

Provided is an optical coupling structure including an optical semiconductor element including a light receiving/emitting portion, an optical transmission path having an optical axis that intersects the optical axis of the optical semiconductor element at a predetermined angle, and an optical coupling portion configured to convert the optical path between the optical semiconductor element and the optical transmission path and optically couple them. The optical coupling portion is made of a resin that is transparent with respect to a transmitted light, the resin adhering to both at least a portion of the light receiving/emitting portion and at least a portion of the end portion of the optical transmission path, and the optical semiconductor element and the optical transmission path are bonded to each other with the resin itself that constitutes the optical coupling portion.

12 Claims, 10 Drawing Sheets

(56) References Cited

U.S. PATENT DOCUMENTS

| | | | |
|---|---|---|---|
| 6,733,190 B2 * | 5/2004 | Kuhara et al. | 385/94 |
| 6,813,418 B1 * | 11/2004 | Kragl | 385/49 |
| 6,832,861 B2 * | 12/2004 | Kragl | 385/88 |
| 6,850,674 B2 * | 2/2005 | Haraguchi et al. | 385/49 |
| 6,898,219 B2 * | 5/2005 | Malone et al. | 372/29.02 |
| 6,910,810 B2 * | 6/2005 | Mine et al. | 385/89 |
| 7,149,376 B2 * | 12/2006 | Uchida et al. | 385/15 |
| 8,113,724 B2 * | 2/2012 | Terada et al. | 385/88 |

FOREIGN PATENT DOCUMENTS

| | | |
|---|---|---|
| JP | 2985791 B2 | 12/1999 |
| JP | 2000-009968 A | 1/2000 |
| JP | 2000-269584 A | 9/2000 |
| JP | 2002-076376 A | 3/2002 |
| JP | 2003-167175 A | 6/2003 |
| JP | 2006-337550 A | 12/2006 |
| JP | 2007178578 A | 7/2007 |
| JP | 2008-304611 A | 12/2008 |
| JP | 2009-020391 A | 1/2009 |
| JP | 2009-198946 A | 9/2009 |
| JP | 2010-009019 A | 1/2010 |
| JP | 2010-197686 A | 9/2010 |
| JP | 2010-217322 A | 9/2010 |
| JP | 2010-217323 A | 9/2010 |
| JP | 2010-237640 A | 10/2010 |
| JP | 2010-237641 A | 10/2010 |
| JP | 2010-237642 A | 10/2010 |

* cited by examiner

OPTICAL COUPLING STRUCTURE AND OPTICAL TRANSRECEIVER MODULE

CROSS REFERENCE TO RELATED APPLICATIONS

This application is a continuation application based on a PCT Patent Application No. PCT/JP2011/050076, filed Jan. 6, 2011, whose priority is claimed on Japanese Patent Application No. 2010-001100 filed Jan. 6, 2010, the entire content of which are hereby incorporated by reference.

BACKGROUND OF THE INVENTION

1. Field of the Invention

The present invention relates to an optical module that is used in optical communication technology, optical transmission technology, and optical information recording technology, and in particular relates to an optical coupling structure that optically couples an optical semiconductor element and an optical transmission path in an optical module.

2. Description of the Related Art

An optical module is equipped with an optical semiconductor element that is mounted on a substrate, and an optical transmission path that is arranged so that the optical axis is parallel with the substrate.

Conventionally, in this type of optical module, in order to optically couple the light receiving/emitting portion of the optical semiconductor element and an end portion of the optical transmission path, the structure as shown in FIG. 16 is generally used. In this structure, by combining a condenser lens 102 that is arranged on an optical semiconductor element 101, and an optical path conversion mirror 103, an optical transmission path 104 (in particular, a core 105 thereof) and the optical semiconductor element 101 are optically connected (optically coupled).

In such a structure, it is necessary for the refractive index of the condenser lens 102 and the reflectance of the optical conversion mirror 103 to be adjusted to desired values. In addition, the number of parts required for optical coupling increases. Moreover, it is necessary to precisely match the respective positional relations of the optical semiconductor element 101, the condenser lens 102, the optical conversion mirror 103, and the optical transmission path 104. For that reason, the cost of components, and the cost of the work related to assembly are high, becoming the principal cause of cost increases.

In order to reduce the manufacturing cost of such an optical module and to provide an optical module at a lower cost, an example of optical device is proposed in Japanese Unexamined Patent Application, First Publication No. 2003-167175, that includes a guide groove in the surface of an optical semiconductor chip mounted substrate, and a tapered surface that is positioned over the optical axis of an optical fiber that is mounted in this guide groove, with a mirror formed in the tapered surface.

In Japanese Patent No. 2985791, a coupling structure of an optical waveguide and a light receiving element is proposed that includes a substrate in which is formed a V-groove having a reflecting surface that is obliquely formed at a position that faces the end portion of an optical waveguide, a refractive index matching agent that fills the space between the end portion of the optical waveguide and the reflecting surface and that has nearly the same refractive index as the core of the optical waveguide, and a light receiving element that receives the outgoing light that is reflected by the reflecting surface.

In Japanese Unexamined Patent Application, First Publication No. H09-197196, a method for joining optical components is disclosed that can achieve highly accurate and simple connections between optical components in an optical transreceiver module. In this method, the optical fiber and the light receiving/emitting element, which are arranged so that the optical axes substantially coincide, are pressure bonded with an uncured transparent resin composition therebetween, and after pulling back the optical fiber and extending the uncured transparent resin composition (photo-curable, thermosetting, or thermoplastic), the extended transparent resin composition is cured.

Japanese Unexamined Patent Application, First Publication No. 2000-269584 proposes a semiconductor laser device in which a semiconductor laser element, a monitor photo diode, and an optical fiber are sealed in a transparent resin, and the rearward output light of the semiconductor laser element is reflected at the interface between the transparent resin and air, and enters the monitor photo diode.

However, in the optical device of Patent Document 1, preparation of a die for forming the guide groove and tapered surface, and the step of forming the mirror with a tapered surface are necessary. As a result, there is the problem of the manufacturing cost increasing. Moreover, in an optical semiconductor chip mounted substrate having a guide groove, since it is necessary to perform flip chip bonding with the optical semiconductor element facing down, the line length from the optical semiconductor element to the integrated circuit that requires wire bonding (for example, between the light receiving element and the IC for amplification) becomes longer. As a result, the problem arises of noise easily containing. Moreover, since it is difficult to perform appearance inspection of the optical semiconductor element that is flip-chip bonded after mounting, it is difficult to discover poor connections thereof.

In the optical coupling structure of Patent Document 2, since it is necessary to form a V groove that has a tapered surface at a position facing the optical fiber that is extremely fine, form a total reflective mirror on that tapered surface, and moreover fill a refractive index matching agent between the end portion of the optical waveguide and the reflective surface, the number of manufacturing steps increases. As a result, there is the problem of the manufacturing cost increasing.

In the method for joining optical components of Patent Document 3, since it is necessary to arrange the optical axes of the optical fiber and the light receiving/emitting element so as to substantially coincide, it can only be applied in the case of both optical axes being coaxial. For that reason, in the case of for example, both optical axes being mutually perpendicular or the like, when attempting to convert an optical path, the problem arises of this method being inapplicable.

Since the semiconductor laser device of Patent Document 4 is for monitoring the rear output light of a semiconductor laser element with a large aperture angle, it can be used even if the efficiency of the optical coupling is low. However, in the case of making an optical signal incident on the light receiving element from an optical fiber with a small aperture angle, or making it incident on an optical fiber from a light emitting element, when the coupling efficiency is low, there is the problem of ensuring the reliability of transmission of the optical signal being difficult. Further, the position and shape of the resin interface that serves as the reflecting surface is considered to depend on the quantity of the applied transparent resin and the shape of a step of the substrate. For that reason, when forming a step in a substrate, since it is necessary to design and manufacture the position and shape of the resin interface in accordance with the shape and size of the step, the manufacturing cost rises. In addition, a reflective surface must exist at the intersection point where the optical axis that is perpendicular to the semiconductor laser element and the optical axis that is perpendicular to the monitor photo diode element intersect. However, forming the resin so that the interface of the resins is positioned just at the position of that intersection point is not easy.

The present invention was achieved in view of the above circumstances, and has an object of providing an optical coupling structure of an optical semiconductor element and an optical transmission path in an optical module that includes an optical coupling portion that can be manufactured at low cost and can transmit an optical signal with higher efficiency, with the optical axis of the optical transmission path and the optical axis of the light receiving/emitting portion in a positional relation forming a predetermined angle.

SUMMARY OF THE INVENTION

In order to solve the aforementioned issues, the present invention employs the following.

(1) An optical coupling structure according to an aspect of the present invention includes: an optical semiconductor element including a light receiving/emitting portion on an upper face thereof and is mounted on a substrate on a side of a lower face thereof; an optical transmission path having an optical axis that intersects the optical axis of the optical semiconductor element at a predetermined angle and is arranged separately from a mounting face of the substrate; and an optical coupling portion configured to convert the optical path between the optical semiconductor element and the optical transmission path and optically couple the optical semiconductor element and the optical transmission path. The optical coupling portion is made of a resin that is transparent with respect to a transmitted light, the resin adhering to both at least a portion of the light receiving/emitting portion of the optical semiconductor element and at least a portion of the end portion of the optical transmission path. The optical semiconductor element and the optical transmission path are bonded to each other with the resin itself that constitutes the optical coupling portion.

(2) In the optical coupling structure of the aforementioned (1), it may be arranged such that the resin that constitutes the optical coupling portion is arranged within the upper face of the optical semiconductor element.

(3) In the optical coupling structure of the aforementioned (1), it may be arranged such that the resin is arranged separately from a power supply wiring that is wire-bonded to the upper face of the optical semiconductor element.

(4) In optical coupling structure of the aforementioned (1) to (3), it may be arranged such that the end face of the optical transmission path located on an inside of the optical semiconductor element inner than the end face of the optical semiconductor element, when viewing the optical semiconductor element from a side and above.

(5) In optical coupling structure of the aforementioned (1) to (4), it may be arranged such that the outer face of the resin that constitutes the optical coupling portion has a shape that is concave toward the light receiving/emitting portion of the optical semiconductor element and the end portion of the optical transmission path.

(6) In optical coupling structure of the aforementioned (1) to (4), it may be arranged such that the outer face of the resin that constitutes the optical coupling portion has a convex shape.

(7) In optical coupling structure of the aforementioned (1) to (6), it may be arranged such that the resin that constitutes the optical coupling portion does not exists at the position of the intersection point where the optical axis of the optical semiconductor element and the optical axis of the optical transmission path intersect; and the position at which the outer face of the resin faces the light receiving/emitting portion is between the intersection point and the light receiving/emitting portion, and the position at which the outer face of the resin faces the end portion of the optical transmission path is between the intersection point and the end portion of the optical transmission path.

(8) In optical coupling structure of the aforementioned (1) to (7), it may be arranged such that the resin that constitutes the optical coupling portion is arranged lower than the height of an upper end of the end face of the optical transmission path.

(9) In optical coupling structure of the aforementioned (1) to (8), it may be arranged such that the shape of the optical coupling portion is any one of a circular shape, an elliptical shape, or a fan shape when viewing the optical coupling portion from above.

(10) In optical coupling structure of the aforementioned (1) to (8), it may be arranged such that the periphery of the optical coupling portion is covered with a gas.

(11) In optical coupling structure of the aforementioned (1) to (8), it may be arranged such that the periphery of the optical coupling portion is covered with a cladding resin layer having a refractive index that is lower than the resin that constitutes the optical coupling portion.

(12) In optical coupling structure of the aforementioned (11), it may be arranged such that the power supply wiring of the optical semiconductor element is covered with the cladding resin layer.

(13) An optical transreceiver module according to an aspect of the present invention includes a light receiving element and a light emitting element that are mounted on a mounting face of the same substrate; a first optical transmission path and a second optical transmission path that are arranged separately from the mounting face of the substrate; a first optical coupling portion that optically couples the light receiving element and the first optical transmission path; and a second optical coupling portion that optically couples the light emitting element and the second optical transmission path, with the light receiving element, the first optical transmission path and the first optical coupling portion constituting a first optical coupling structure, and the light emitting element, the second optical transmission path and the second optical coupling portion constituting a second optical coupling structure. One or both of the first optical coupling structure and the second optical coupling structure constitutes the optical coupling structure according to any one of the aforementioned (1) to (12).

(14) A method of manufacturing the optical coupling structure according to an aspect of the present invention is a method of manufacturing the optical coupling structure according to any one of the aforementioned (1) to (12), the method including the steps of applying a resin to a light receiving/emitting portion of an optical semiconductor element that is provided on a substrate; inserting an optical transmission path into the resin so as to be parallel to the substrate; moving the optical transmission path in a direction away from the semiconductor element and obliquely upward; and curing the resin into an optical coupling portion. Whether to make the shape of the optical coupling portion into a convex shape or a concave shape is controlled based on a relationship between the amount of the applied resin, the viscosity of the resin, the insertion amount of the optical transmission path, the movement amount obliquely upward of the optical transmission path, and the time before curing the resin, the relationship being found in advance.

(15) In the method of manufacturing an optical structure according to the aforementioned (14), it may be arranged such that the resin is applied to the light receiving/emitting portion, separately from the power supply wiring that is wire-bonded to the upper face of the optical semiconductor element.

According to the optical coupling structure of the aforementioned (1), it is possible to manufacture an optical connection portion at a low cost without using a number of components, and moreover it is possible to transmit optical signals with higher efficiency.

Since it is possible to mount a semiconductor element with the optical axis thereof perpendicular to a substrate (the vertical direction in the present invention), it is possible to mount the light receiving/emitting portion of the optical semiconductor element facing the opposite side of the mounting face. Thereby, mounting by die bonding or wire bonding becomes easy. Moreover, it is possible to connect the wiring in the shortest line length, which is important for transmission characteristics, and excellent transmission characteristics are obtained with preventing noise. Further, it becomes easy to perform appearance inspection of the bonding and thus easy to find poor connections.

DETAILED DESCRIPTION OF THE PREFERRED EMBODIMENTS

Hereinbelow, embodiments of the present invention shall be described with reference to the drawings.

Figure 3:
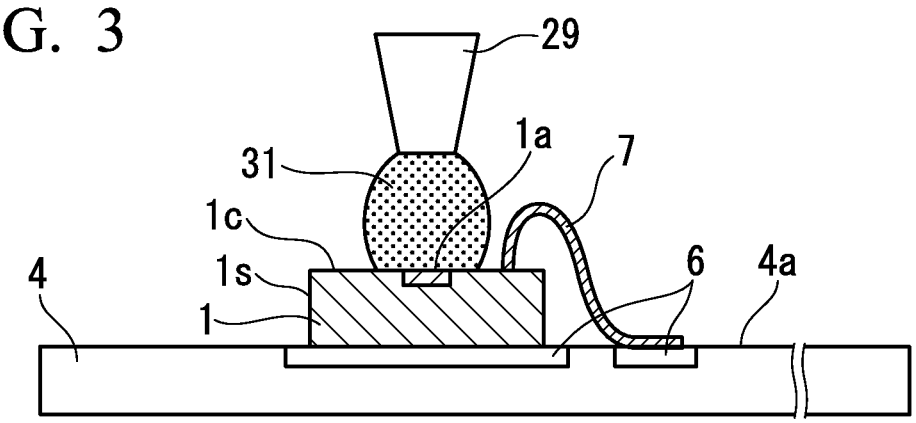
FIG. 3 is a cross-sectional view for describing the manufacturing process of the optical coupling portion.
Figure 4:
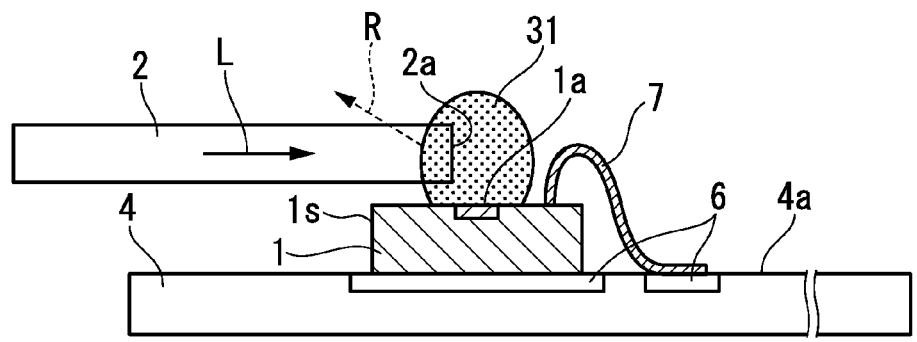
FIG. 4 is a cross-sectional view for describing the manufacturing process of the optical coupling portion.

In the following description, with a surface on which a light receiving/emitting portion of an optical semiconductor element is present serving as a basis, a direction heading away from the light receiving/emitting portion is up (for example, upward in FIGS. 1A to 2C), and a direction approaching the light receiving/emitting portion is down (for example, downward in FIGS. 1A to 2C), with respect to the vertical direction. Moreover, a direction perpendicular to the vertical direction according to the aforementioned definition (for example, the left-right direction in FIGS. 1A to 2C) is the horizontal direction. The vertical direction and the horizontal direction in the present invention, except for the case of a transparent resin 31 being uncured and having fluidity as shown in FIG. 3 and FIG. 4, does not depend on the direction of gravity.

Figure 1A:
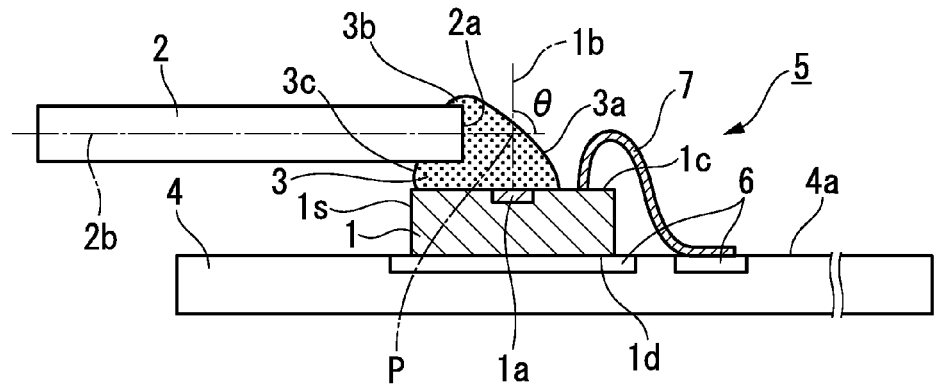
FIG. 1A is a cross-sectional view that shows an example of the optical module in the case of the outer face of the optical coupling portion having a convex shape in the optical coupling structure according to the first embodiment of the present invention.

FIG. 1A shows an example of an optical module that includes an optical coupling structure according to the first embodiment.

An optical module 5 shown in FIG. 1A includes an optical semiconductor element 1 that is mounted on a mounting face 4a that is the upper face of a substrate 4, an optical transmission path 2 that extends along the mounting face 4a of the substrate 4 and that is arranged separately from the mounting face 4a of the substrate 4, and an optical coupling portion 3 that converts the optical path between the optical semiconductor element 1 and the optical transmission path 2 and optically couples the optical semiconductor element 1 and the optical transmission path 2. The optical axis 1b of the optical semiconductor element 1 and the optical axis 2b of the optical transmission path 2 mutually intersect at a predetermined angle θ. Here, the predetermined angle θ is 0°<θ<180°.

When the optical semiconductor element 1 is a light emitting element, "converting the optical path between the optical semiconductor element and the optical transmission path" means changing the optical path (namely, the direction of movement of light) so that light emitted from the optical semiconductor element 1 may enter the optical transmission path 2. On the other hand, when the optical semiconductor element 1 is a light receiving element, "converting the optical path between the optical semiconductor element and an optical transmission path" means changing the optical path (namely, the light travel direction) so that the light emitted from the optical transmission path 2 enters the optical semiconductor element 1. Note that the optical component joining method of Patent Document 3 mentioned above differs completely from the present invention in that both optical axes are coaxial and do not require conversion of the optical path.

In the present embodiment, the end portion 2a of the optical transmission path 2 is not located on the extension line of the optical axis 1b of the optical semiconductor element 1. That is to say, when the optical semiconductor element 1 is a light emitting element, and the light emitted from the optical semiconductor element 1 is transmitted along the optical axis 1b, the light does not enter the end portion 2a of the optical transmission path 2. The positional relationship between the optical semiconductor element 1 and the optical transmission path 2 therefore requires the existence of a predetermined optical coupling portion 3 in order for the light emitted from the optical semiconductor element 1 to reach the end portion 2a of the optical transmission path 2.

And the light receiving/emitting portion 1a of the optical semiconductor element 1 is not located on the extension line of optical axis 2b of the optical transmission path 2. That is to say, in the case of the optical semiconductor element 1 being a light receiving element, when the light emitted from the optical transmission path 2 is transmitted along the optical axis 2b, the light does not enter the light receiving/emitting portion 1a of the optical semiconductor element 1. The positional relationship between the optical semiconductor element 1 and the optical transmission path 2 therefore requires the existence of the predetermined optical coupling portion 3 in order for the light emitted from the optical transmission path 2 to reach the light receiving/emitting portion 1a of the optical semiconductor element 1.

The optical semiconductor element 1 includes the light receiving/emitting portion 1a as a portion that causes the emission or allows the entrance of an optical signal.

When the optical semiconductor element 1 is a light receiving element, the light receiving/emitting portion 1a is a light receiving portion. When the optical semiconductor element 1 is a light emitting element, the light receiving/emitting portion 1a is a light emitting portion.

Examples of a light emitting element include a light emitting diode (LED), a laser diode (LD), and a vertical cavity surface emitting laser (VCSEL).

Examples of a light receiving element include a photo diode (PD).

The light receiving/emitting portion 1a is provided on an upper face 1c of the optical semiconductor element 1. Regarding the vertical direction in the present invention, with the mounting surface 4a on which the optical semiconductor element 1 is mounted on the substrate 4 serving as a basis, the direction heading away from the substrate 4 is up (upward in FIGS. 1A to 1C), and the direction approaching the substrate 4 is down (downward in FIGS. 1A to 1C). Moreover, the direction perpendicular to the vertical direction according to the aforementioned definition (the left-right direction in FIGS. 1A to 1C) is the horizontal direction. The vertical direction and the horizontal direction in the present invention, except for the case of the transparent resin 31 being uncured and having fluidity as shown in FIG. 3 and FIG. 4, does not depend on the direction of gravity.

The optical semiconductor element 1 is electrically connected by a jointing material to a circuit wiring 6 formed on the mounting face 4a of the substrate 4. For example, in the case of the present embodiment, the optical semiconductor element 1 is electrically connected with the circuit wiring 6 by power supply wiring that consists of electrodes (not shown) formed on the upper portion (front face) of the optical semiconductor element 1, and a wire interconnect 7, and the like. The lower face (rear face) 1d of the optical semiconductor element 1 and the circuit wiring 6 are electrically connected with an electroconductive adhesive (not shown).

As the substrate 4, it is possible to use various types of general insulating substrates, for example a glass-epoxy substrate or a ceramic substrate. Examples of the wire interconnect 7 include gold (Au) wire, aluminum (aluminum) wire, and copper (Cu) wire.

Examples of the optical transmission path 2 include optical fibers such as silica glass optical fiber and plastic optical fiber (POF), and a planar optical waveguides such as a quartz optical waveguide and a polymer optical waveguide.

It is preferable that the optical axis 2b of the optical transmission path 2 be linear at least in the vicinity of the end portion 2a, so that the direction of the emitted and incident light with respect to the optical coupling portion 3 is constant.

The optical axis 1b of the optical semiconductor element 1 and the optical axis 2b of the optical transmission path 2 (in particular, the optical axis 2b near the end portion 2a) are arranged so as to intersect at a predetermined angle θ. It is preferable that the optical axes 1b, 2b of the optical semiconductor element 1 and the optical transmission path 2 be arranged so as to be perpendicular to each other (or approximately perpendicular).

The optical coupling portion 3 made of resin that is transparent with respect to the light being transmitted therethrough. The resin that constitutes the optical coupling portion 3 adheres to at least a portion of the light receiving/emitting portion 1a of the optical semiconductor element 1 and at least a portion of the end portion 2a of the optical transmission path 2.

Transparent resin mentioned here refers to one that is capable of passing light that is transmitted between the optical semiconductor element 1 and the optical transmission path 2. Therefore, it is not necessarily limited to one that has a transparent and colorless tone under visible light. Moreover, since the optical path length in the resin in which light is transmitted is short, it should be transparent to some extent.

It is possible to use a UV-curable resin or a thermosetting resin, for example, as the transparent resin. Specific examples of a transparent resin include an acrylic resin, an epoxy resin, and a silicon resin.

Figure 5:
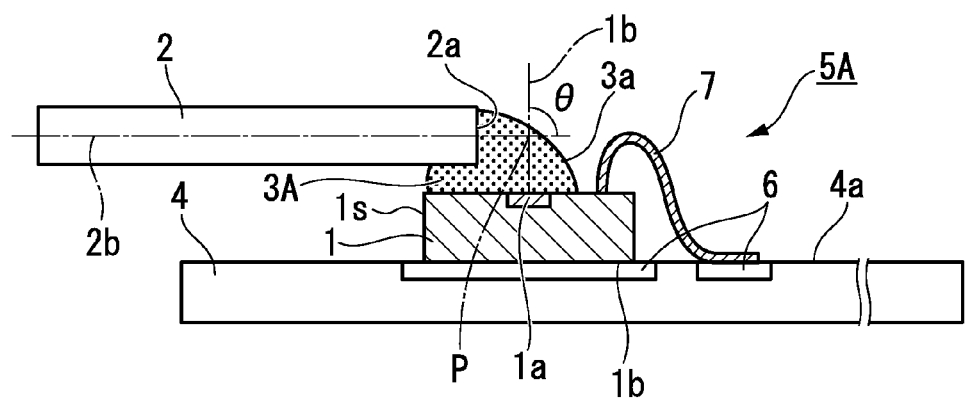
FIG. 5 is a cross-sectional view that describes another shape in the case of the outer face of the optical coupling portion having a convex shape.

With regard to the shape of the optical coupling portion 3, FIG. 1A shows the case of the optical coupling portion 3 covering the entire face of the end portion 2a of the optical transmission path 2, and the upper end of the optical coupling portion 3 adhering until the upper portion of the optical transmission path 2. Instead of that, a portion of the end portion 2a of the optical transmission path 2 may be exposed to the outside of the optical coupling portion 3A in the same manner as the optical module 5A as shown in FIG. 5. In the case shown in this FIG. 5, the resin that constitutes the optical coupling portion 3A is arranged lower than the height 2d of the upper end 2c of the end face 2a of the optical transmission path 2 (refer to FIG. 8), within the plane including the optical axis 1b of the optical semiconductor element 1, and the optical axis 2b of the optical transmission path 2 (within the plane on the page of FIG. 5) and outside the plane (the near side and far side on the page of FIG. 5). For that reason, the distance from the light receiving/emitting portion 1a of the optical semiconductor element 1 to the outer face 3a of the optical coupling portion 3a, and the distance from the end face 2a of the optical transmission path 2 to the outer face 3a of the optical coupling portion 3 becomes shorter than the cases of FIG. 1A to 1C. In the structure shown in FIG. 5, it is preferable for the total surface of the core (not shown) exposed at the end portion 2a of the optical transmission path 2 to be covered by the optical coupling portion 3A.

Note that the height 2d of the upper end 2c is a height based on the mounting face 4a of the substrate 4 (the distance in a direction perpendicular to the mounting face 4a).

Figure 1B:
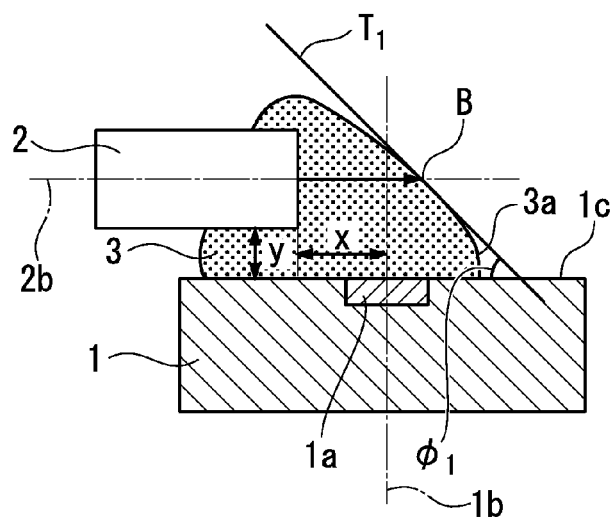
FIG. 1B is an enlarged view of a principal portion of the optical module shown in FIG. 1A, showing the case of the optical semiconductor element being a light receiving element.

Here, in the coupling portion 3, in the case of the optical semiconductor element 1 being a light receiving element, the light that enters the optical coupling portion 3 from the optical transmission path 2 is reflected at the interface 3a (the outer face 3a of the optical coupling portion 3) between the transparent resin that constitutes the optical coupling portion 3 and the external gas (for example, air or dry nitrogen gas) due to the difference in refractive index, and enters the optical semiconductor element 1 (refer to FIG. 1B). At this time, with regard to a tangent $T_1$ of the outer face 3a at position B where the optical axis 2b of the optical transmission path 2 and the outer face 3a intersect, the angle $\phi_1$ formed by the tangent $T_1$ and the upper face 1c of the optical semiconductor element 1 is preferably $30°<\phi_1<60°$. Thereby, even in the case of the light that is emitted from the end face 2a of the optical transmission path 2 having a certain amount of spread angle, it is possible to effectively condense the light to the light receiving element. As a result, it is possible to inhibit an increase in the connection loss between the optical transmission path 2 and the optical semiconductor element 1.

Further, it is preferable that the distance x from the end face 2a of the optical transmission path 2 to the optical axis 1b of the optical semiconductor element 1 satisfy $30<x<60$ μm, and that the distance y from the optical axis 2b of the optical transmission path 2 to the optical semiconductor element 1 satisfy $0<y<20$ μm. When the distance x is 60 μm or more, and the distance y is 20 μm or more, in the case of light with a particularly large spread angle, there is a risk of the proportion of light that cannot be received by the light receiving portion 1a increasing due to the spread of the light. When the distance x satisfies $30<x<60$ μm, and the distance y satisfies $0<y<20$ μm, it is possible to inhibit an increase in the connection loss due to the spread of the light.

Figure 1C:
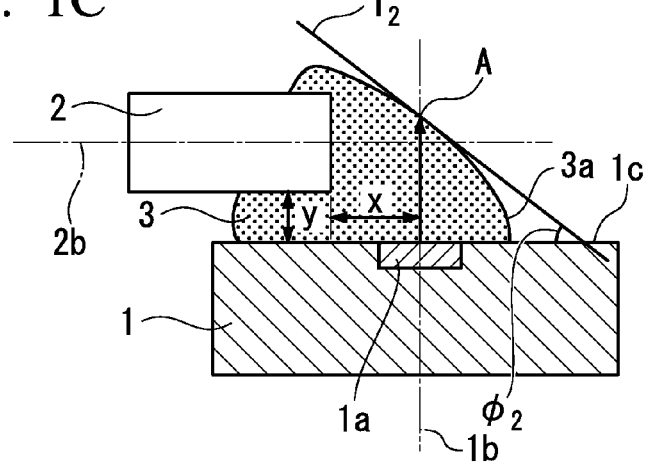
FIG. 1C is an enlarged view of a principal portion of the optical module shown in FIG. 1A, showing the case of the optical semiconductor element being a light emitting element.

On the other hand, when the optical semiconductor element 1 is a light emitting element, the light that enters the optical coupling portion 3 from the optical semiconductor element 1 is reflected at the interface 3a between the transparent resin that constitutes the optical coupling portion 3 and external gas due to the refractive index difference, and enters the optical transmission path 2 (refer to FIG. 1C). At this time, with regard to the tangent $T_2$ of the outer face 3a at position A where the optical axis 1b of the optical semiconductor element 1 and the outer face 3a intersect, the angle $\phi_2$ formed by the tangent $T_2$ and the upper face 1c of the optical semiconductor element 1 is preferably $30°<\phi_2<60°$. Thereby, even in the case of the light that is emitted from the optical semiconductor element 1 having a certain amount of spread angle, it is possible to effectively make the light enter the optical transmission path 2. As a result, it is possible to inhibit an increase in the connection loss.

Further, similarly to the above, since the optical path length within the optical coupling portion 3 becomes shorter since the distance x satisfying $30<x<60$ μm, and that the distance y satisfies $0<y<20$ μm, it is possible to inhibit an increase in the connection loss due to the spread of the light.

The optical semiconductor element 1 and the optical transmission path 2 are connected only by the resin that constitutes the optical coupling portion 3, without an index matching material or an air gap or the like either between the optical semiconductor element 1 and the optical coupling portion 3 or between the optical transmission path 2 and the optical coupling portion 3.

The optical coupling portion 3 of the present embodiment has the following configuration in order to easily realize optical coupling between the optical semiconductor element 1 and the optical transmission path 2.

The outer face 3a of the optical coupling portion 3 forms an interface with the external gas, and the optical semiconductor element 1 and the optical transmission path 2 are connected by the resin itself that constitutes the optical coupling portion 3. Since the optical semiconductor element 1 and the optical transmission path 2 is connected by the resin itself that constitutes the optical coupling portion 3, it is possible to easily and at low cost convert the optical path between the optical semiconductor element 1 and the optical transmission path 2, and optically couple the optical semiconductor element 1 and the optical transmission path 2 with high efficiency, just by adjusting the positional relationship between the optical semiconductor element 1 and the optical transmission path 2, without using components other than the optical semiconductor element 1, the optical transmission path 2, and the optical coupling portion 3 or an adhesive agent, and without adjusting the positional relationship with components other than the optical semiconductor element 1 and the optical transmission path 2.

Note that in the present specification, "bonded by the resin itself" refers that the resin that constitutes the optical coupling portion with the optical semiconductor element and the resin that constitutes the optical coupling portion with the optical transmission path are directly connected, and a separate material besides the resin (an index matching material or air due to gaps) does not exist between the optical semiconductor element and the optical coupling portion, and between the optical transmission path and the optical coupling portion. It may be configured as defined above in the state of a pulling force not being applied (resting state), irrespective of the adhesive strength with respect to the pulling.

It is difficult to adjust the positional relationship between the optical semiconductor element 1, the optical transmission path 2, and components other than the optical semiconductor element 1 and the optical transmission path 2, and it necessary to produce the components other than the optical semiconductor element 1 and the optical transmission path 2 with a high degree of accuracy. Therefore, it is difficult to manufacture the optical coupling portion 3 at a low cost that converts the optical path and optically couples.

Further, in the present invention, it is possible to manufacture the optical coupling structure at a low cost, without the need to carry out a special process such as bending the distal end of the optical transmission path 2.

Moreover, the end portion 2a of the optical transmission path 2 and the light receiving/emitting portion 1a of the optical semiconductor element 1 are optically coupled with the optical coupling portion 3 that is configured by a single transparent resin, and so it is possible to manufacture it at an extremely low cost and with a simple process.

A simple transparent resin here covers all meanings such as the component (composition) being uniform (single), the transmittance of light of a particular wavelength being uniform, and physically not consisting of two or more layers (no interface).

Regarding the shape of the optical coupling portion 3 of the present embodiment, as shown in FIGS. 1A, 1B, and 1C, the outer face 3a has a convex shape. In particular, in a configuration in which there is a distance of a certain amount or more between the optical transmission path 2 and the optical semiconductor element 1 (light receiving/emitting portion 1a), since the optical path length becomes longer, it is possible to effectively condense the diffused light to the optical semiconductor element 1 due to the lens effect of the convex-shaped outer face 3a. As a result, optical connection loss can be suppressed to a fixed amount or less. Moreover, when the spread angle of the light emitted from the optical transmission path 2 (or optical semiconductor element 1) is comparatively small, the above-mentioned effect becomes more remarkable. That is to say, since diffusion of light becomes comparatively small when the spread angle of the emitted light is comparatively small, the lens effect of the outer face 3a becomes more dominant than the optical path length in the optical coupling portion 3 with respect to connection loss. Further, in the configuration as described above, by improving the light condensing property in the outer face 3a, it is possible to easily perform alignment of the optical transmission path 2 with respect to the light receiving/emitting portion 1a of the optical semiconductor element 1.

In this convex-shaped outer face 3a, (a) a position A facing the light receiving/emitting portion 1a may have a shape convex toward the opposite side of the light receiving/emitting portion 1a, (b) a position B facing the end portion 2a of the optical transmission path 2 may have a shape convex toward the opposite side of the end portion 2a of the optical transmission path 2, (c) the space between the position A facing the light receiving/emitting portion 1a and the position B facing the end portion 2a of the optical transmission path 2 may be convex-shaped, or two or more among (a) to (c) may be met.

Moreover, in the embodiment shown in FIG. 1A, the resin that constitutes the optical coupling portion 3 is present at the position of the intersection point P where the optical axis 1b of the optical semiconductor element 1 and optical axis 2b of the optical transmission path 2 intersect. Note that even in the case of the outer face 3a of the optical coupling portion 3 having a convex shape, it can be arranged such that the resin is not present at the position of the intersection point P of the optical axes 1b and 2b, the position at which the outer face 3a of the resin faces the light receiving/emitting portion 1a is between the intersection point P and the light receiving/emitting portion 1a, and the position at which the outer face 3a of the resin faces the end portion 2a of the optical transmission path 2 is between the intersection point P and the end portion 2a of the optical transmission path 2. In this case, the optical path within the optical coupling portion 3 is further shortened, and therefore preferable.

The resin that constitutes the optical coupling portion 3, when the upper face 1c of the optical semiconductor element 1 is viewed from above, is preferably arranged within the upper face 1c. By arranging the resin within the upper face 1c of the optical semiconductor element 1, it is easy to control the spread of the resin without using a die or the like, and it is possible to stably manufacture the shape of the optical coupling portion 3.

In the optical coupling portion 3 of the present embodiment, it may be arranged such that the portions that do not contribute to the transmission of light, for example, in FIG. 1A, the portion 3b that overhangs the upper side of the optical transmission path 2, and the portion 3c sandwiched between the lower side of the optical transmission path 2 and the upper face 1c of the optical semiconductor element 1 have a convex shape. However, when manufacturing the optical coupling portion 3, it is not desirable for the resin that constitutes the optical coupling portion 3 to drip from the portion 3c of the lower side of the optical transmission path 2 onto the end face 1s of the optical semiconductor element 1.

Further, it is preferable that the resin that constitutes the optical coupling portion 3 be arranged separately from the power supply wiring (wire interconnect) 7 that is wire bonded to the upper face of the semiconductor element 1 without making contact with the wire interconnect 7. When the resin makes contact with the wire interconnect 7, the shape of the resin disintegrates, and excellent coupling efficiency is not obtained. Moreover, since the resin shape changes with slight differences in the manner of contact between the resin and the wire interconnect 7, variations in the resin shape easily occur. Since controlling the manner of contact between the resin and the wire interconnect 7 is extremely difficult, it is extremely effective for manufacturing stability to ensure that the wire interconnect 7 does not make contact.

Note that the wire interconnect 7 that should avoid contact with the resin in this case is that which projects upward from the upper face 1c of the semiconductor element 1. In the case of an external interconnect of the optical semiconductor element 1 being formed in a planar manner along the upper face 1 and a side face of the optical semiconductor element 1, it is not necessary to avoid contact. In addition, this is not limited to the wire interconnect 7, and in the case of there being structures that greatly project from the upper face 1c of the optical semiconductor element 1, it is preferable that the resin that constitutes the optical coupling portion avoid contact with these structures.

As shown in FIGS. 1A to 1C and FIGS. 12A to 12C, the end face 2a of the optical transmission path 2, when viewing the optical semiconductor element 1 from the side (FIGS. 1A to 1C) and above (FIGS. 12A to 12C), is preferably located on the inside of the optical semiconductor element 1 inner than the end face 1s of the optical semiconductor element 1 (the surrounding side face that encloses the upper face 1). When the end face 2a of the optical transmission path 2 is located on the inside of the optical semiconductor element 1, it is possible to shorten the optical path length within the optical coupling portion 3.

Figure 12A:
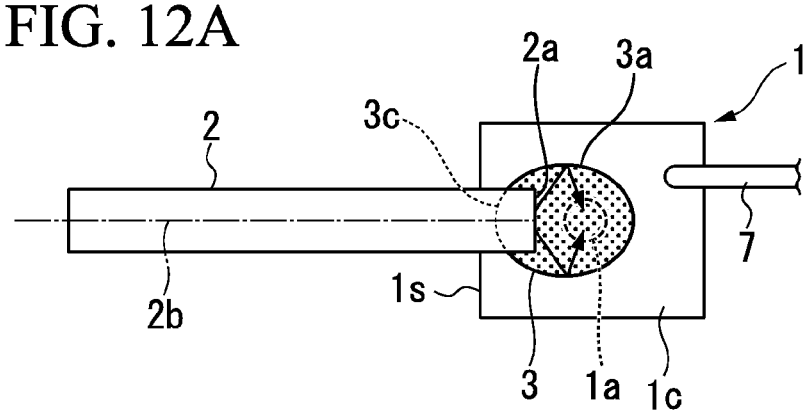
FIG. 12A is a top view that shows the shape of the optical module according to an embodiment of the present invention when viewed from above.
Figure 12B:
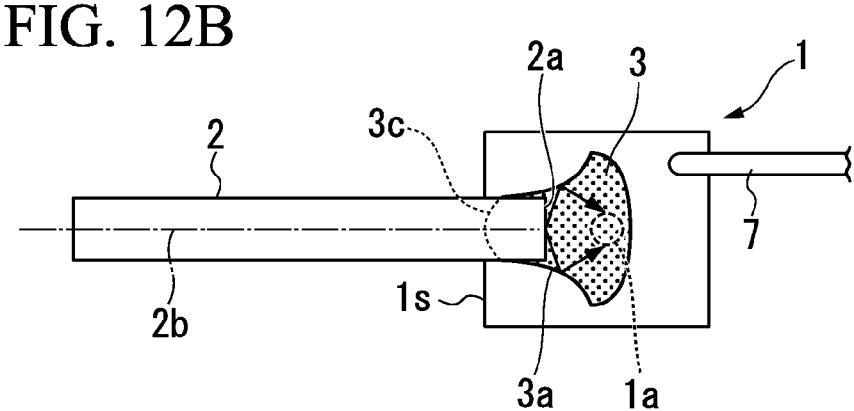
FIG. 12B is a top view that shows the shape of the optical module according to an embodiment of the present invention when viewed from above.
Figure 12C:
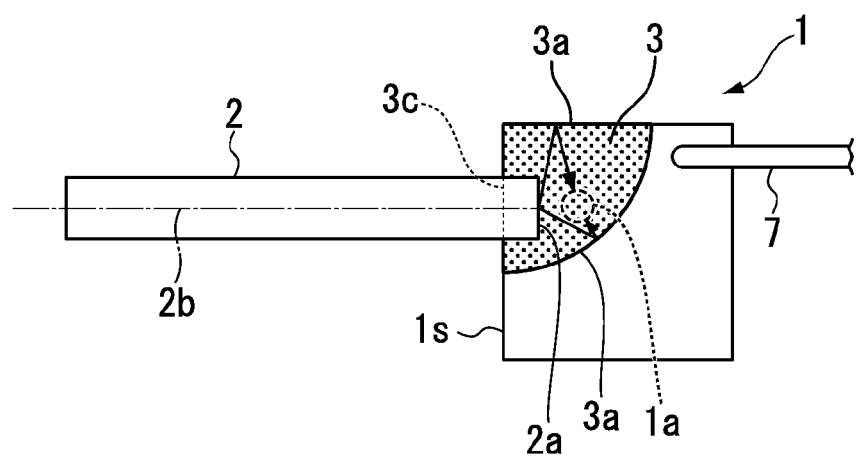
FIG. 12C is a top view that shows the shape of the optical module according to an embodiment of the present invention when viewed from above.

Moreover, as shown in FIG. 12A, when seen from above, the shape of the optical coupling portion 3 preferably has a circular shape or an elliptical shape. Further, as shown in FIGS. 12B and 12C, when viewed from above, the shape of the optical coupling portion 3 more preferably has a fan shape.

Figure 16:
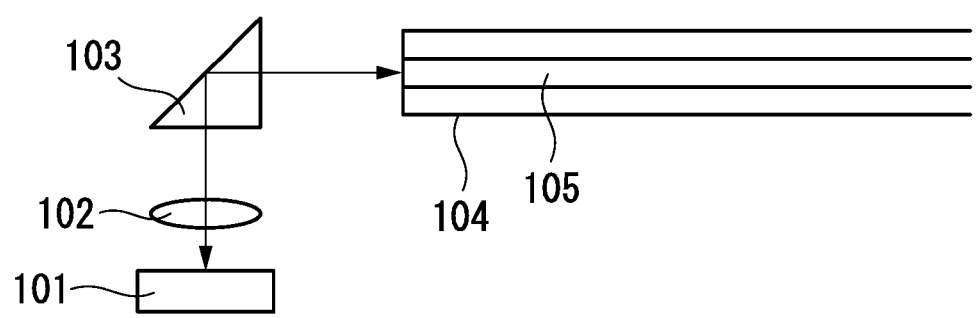
FIG. 16 is a schematic view that describes the method of optical coupling in a conventional optical module.

In the case of using a mirror with a rectangular shape seen from above as in the conventional manner (the shape when viewing from above the optical path conversion mirror 103 shown in FIG. 16), it is not possible to concentrate the light emitted from the optical transmission path 2 with a certain amount of spread angle onto the light receiving/emitting portion 1a of the optical semiconductor element 1, and as a result, there is an increase in the connection loss. On the other hand, since the optical coupling portion 3 has a circular shape or an elliptical shape when viewed from above, the distance from the light emitting portion (the end face 2a of the optical transmission path 2) to the outer face 3a of the optical coupling portion 3, or the distance from the outer face 3a to the light receiving/emitting portion 1a (that is to say, the optical path length within the optical coupling portion 3) becomes shorter, and the emitted light is reflected by the outer face 3a so as to collect at the light receiving/emitting portion 1a. Accordingly, it is possible to further suppress connection loss between the optical semiconductor element 1 and the optical transmission path 2.

Further, in the case of the shape of the optical coupling portion 3 having a fan shape when viewed from above, since it is possible to shorten the optical path length compared to the case of having a circular shape or an elliptical shape, a further reduction in connection loss is achieved.

Figure 2A:
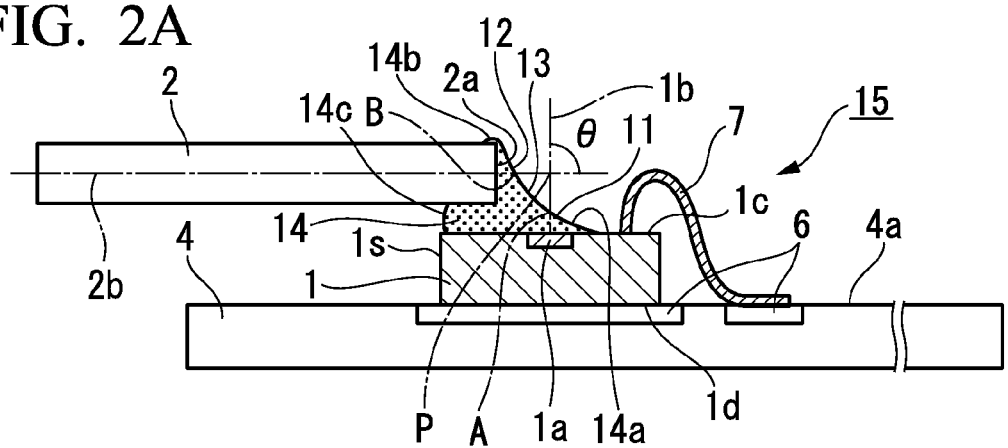
FIG. 2A is a cross-sectional view that shows an example of the optical module in the case of the outer face of the optical coupling portion having a concave shape, in the optical coupling structure according to the first embodiment of the present invention.

Moreover, FIG. 2A shows another example of an optical module including the optical coupling structure according to the first embodiment. In the optical module 15 shown in FIG. 2A, the outer face of the resin that constitutes the optical coupling portion 14 has a shape that is concave toward the light receiving/emitting portion 1a of the optical semiconductor element 1 and the end portion 2a of the optical transmission path 2. In this way, since the outer face of the resin that constitutes the optical coupling portion 14 has a shape concave toward the light receiving/emitting portion 1a of the optical semiconductor element 1 and the end portion 2a of the optical transmission path 2, it is possible to shorten the optical path length within the optical coupling portion 14.

Further, it is preferable that the transparent resin that constitutes the optical coupling portion 14 preferably be not exist at the position of the intersection point P where the optical axis 2b of the optical transmission path 2 and the optical axis 1b of the optical semiconductor element 1 intersect, and the outer face 14a of the optical coupling portion 14 (the interface between the optical coupling portion 14 and the outside gas) have a shape that is concave toward the light receiving/emitting portion 1a of the optical semiconductor element 1 and the end portion 2a of the optical transmission path 2.

Here, in order for the outer face 14a of the optical coupling portion 14 to have a concave shape, it is required to have:

(1) a concave portion 11 in which the position A facing the light receiving/emitting portion 1a is concave toward the light receiving/emitting portion 1a, (2) a concave portion 12 in which the position B facing end portion 2a of the optical transmission path 2 is concave toward the side of the end portion 2a of the optical transmission path 2, and (3) a concave portion 13 in which the space between the position A facing the light receiving/emitting portion 1a and the position B facing end portion 2a of the optical transmission path 2 is concave.

Figure 2B:
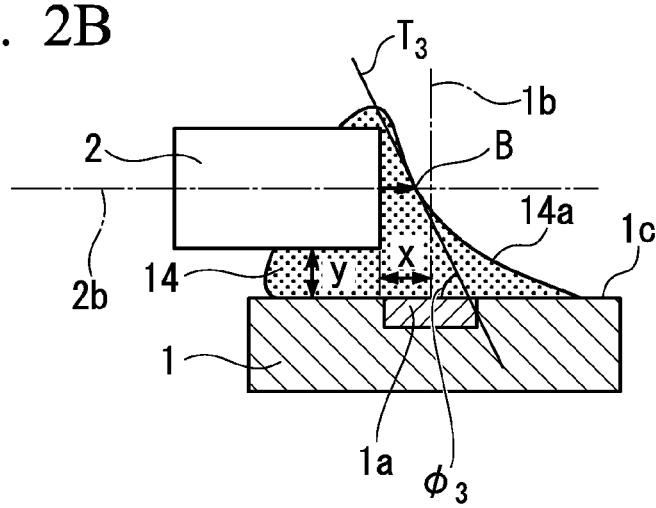
FIG. 2B is an enlarged view of a principal portion of the optical module shown in FIG. 2A, showing the case of the optical semiconductor element being a light receiving element.

Moreover, in the case of the optical semiconductor element 1 being a light receiving element, with regard to the tangent $T_3$ of the outer face 14a at position B where the optical axis 2b of the optical transmission path 2 and the outer face 14a intersect, the angle $\phi_3$ formed by the tangent $T_3$ and the upper face 1c of the optical semiconductor element 1 is preferably 30°<$\phi_3$<60° (refer to FIG. 2B). Thereby, it is possible to effectively condense the light to the light receiving element, and it is possible to inhibit an increase in the connection loss.

Moreover, it is preferable that the distance x from the end face 2a of the optical transmission path 2 to the optical axis 1b of the optical semiconductor element 1 satisfy 30<x<60 µm, and that the distance y from the optical axis 2b of the optical transmission path 2 to the optical semiconductor element 1 satisfy 0<y<20 µm. When the distance x is 60 µm or more, and the distance y is 20 µm or more, in the case of light with a particularly large spread angle, there is a risk of the proportion of light that cannot be received by the light receiving portion 1a increasing due to the diffusion of the light. When the distance x satisfies 30<x<60 µm, and the distance y satisfies 0<y<20 µm, it is possible to inhibit an increase in the connection loss due to the diffusion of the light.

Figure 2C:
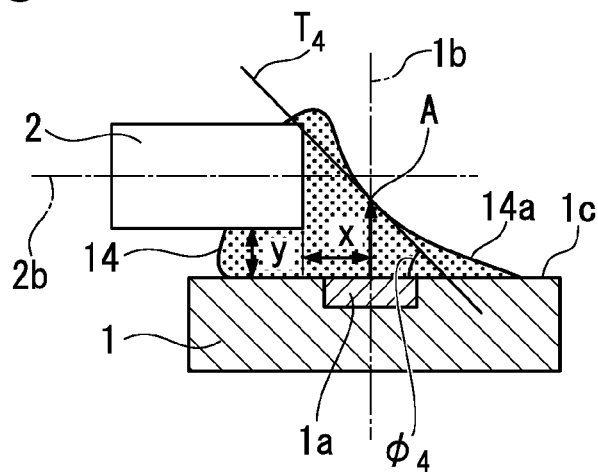
FIG. 2C is an enlarged view of a principal portion of the optical module shown in FIG. 2A, showing the case of the optical semiconductor element being a light emitting element.

On the other hand, when the optical semiconductor element 1 is a light emitting element, with regard to the tangent $T_4$ of the outer face 14a at position A where the optical axis 1b of the light emitting element and the outer face 14a intersect, the angle $\phi_4$ formed by the tangent $T_4$ and the upper face 1c of the optical semiconductor element 1 is preferably 30°<$\phi_4$<60° (refer to FIG. 2C). Thereby, it is possible to effectively condense the light that is emitted from the optical semiconductor element 1 to the optical transmission path 2 (e.g., the core in the case of the optical transmission path 2 being an optical fiber), and it is possible to inhibit an increase in the connection loss. Further, similarly to the above, it is preferable that the distance x from the end face 2a of the optical transmission path 2 to the optical axis 1b of the optical semiconductor element 1 satisfy 30<x<60 µm, and that the distance y from the optical axis 2b of the optical transmission path 2 to the optical semiconductor element 1 satisfy 0<y<20 µm. The same effect as mentioned above is obtained.

Figure 6:
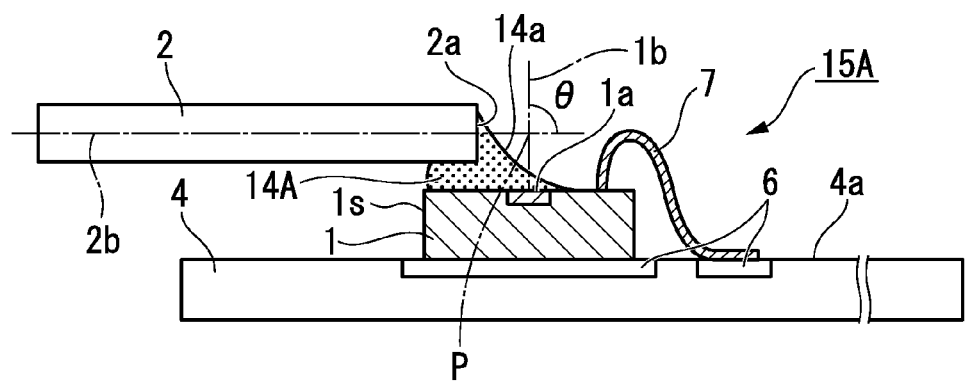
FIG. 6 is a cross-sectional view that describes another shape in the case of the outer face of the optical coupling portion having a concave shape.

It may be arranged such that the portions that do not contribute to the transmission of light, for example, in FIG. 2A the portion 14b that overhangs the upper side of the optical transmission path 2, and the portion 14c sandwiched between the lower side of the optical transmission path 2 and the upper face 1c of the optical semiconductor element 1 have a convex shape. Moreover, in the manner of the optical module 15A shown in FIG. 6, a portion of the end portion 2a of the optical transmission path 2 may be exposed to the outside of the optical coupling portion 14A without the portion 14b that overhangs the upper side of the optical transmission path 2.

Here, the concave portion 11 on the light receiving/emitting portion 1a side of (1) may form a concave surface in which the outer face 14a of the resin is concave to the resin side, in the vicinity of the position A at which the optical axis 1b of the optical semiconductor element 1 intersects with the outer face 14a of the resin.

Moreover, the concave portion 12 on the optical transmission path 2 side of (2) may form a concave surface in which the outer face 14a of the resin is concave to the resin side, in the vicinity of the position B at which the optical axis 2b of the optical transmission path 2 intersects with the outer face 14a of the resin.

Further, the concave portion 13 at the intermediate portion of (3) may form a concave surface in which the outer face 14a of the resin is concave, such that a segment AB that connects between the position A at which the optical axis 1b of the optical semiconductor element 1 intersects with the outer face 14a of the resin, and the position B at which the optical axis 2b of the optical transmission path 2 intersects with the outer face 14a of the resin is outside of the resin (on the outer gas side).

In the case of the optical semiconductor element 1 being a light receiving element, since the optical semiconductor element 1 and the optical transmission path 2 are connected (unified) with the resin itself that constitutes the optical coupling portion 14, the optical coupling portion 14 of the present embodiment converts the optical path between the optical semiconductor element 1 and the optical transmission path 2 at a low cost and in a simple manner, and can optically couple the optical semiconductor element 1 and the optical transmission path 2 with high efficiency.

Moreover, the resin that constitutes the optical coupling portion 14 is arranged within the upper face 1c, when viewing the upper face 1c of the optical semiconductor element 1 from the above, whereby it is possible to easily control the spread of the resin without using a die or the like, and to stably manufacture the shape of the optical coupling portion 14 that consists of the resin.

Since the resin that constitutes the optical coupling portion 14 does not make contact with the power supply wiring 7 that is wire-bonded to the upper face of the optical semiconductor element 1, it is possible to manufacture the optical connection structure of the present embodiment without causing variations in the resin shape of the optical coupling portion 14.

Further, since the end face 2a of the optical transmission path 2, when viewing the optical semiconductor element 1 from the side and above, is located on the inside of the optical semiconductor element 1 inner than the end face 1s of the optical semiconductor element 1, it is possible to shorten the optical path length within the optical coupling portion 14. Moreover when viewing the optical coupling portion 14 from above, the optical coupling portion 14 preferably has a circular shape, an elliptical shape, or a fan shape. The same effects as those described for the convex shape are obtained.

Figure 7:
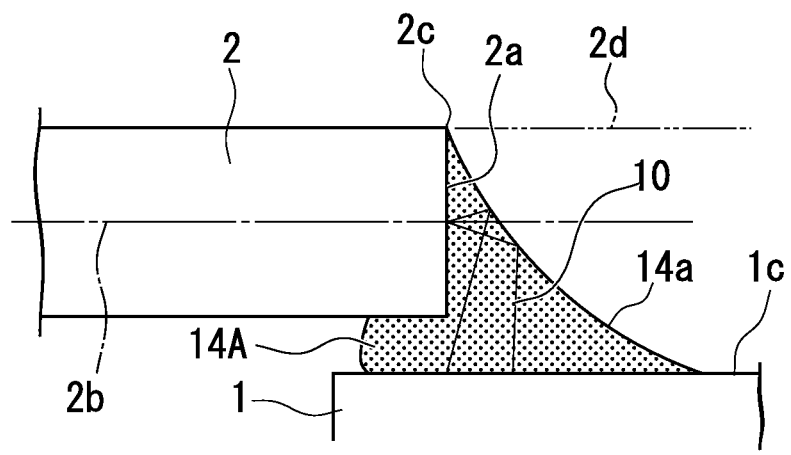
FIG. 7 is a cross-sectional view that describes the case of the outer face of the optical coupling portion having a concave shape in the optical coupling structure according to an embodiment of the present invention.

Since the outer face 14a of the optical coupling portion 14 has a concave shape, when the light 10 that is emitted from the optical transmission path 2 and reflected by the outer face 14a of the optical coupling portion 14 is received by the light receiving/emitting portion 1a of the optical semiconductor element 1, it is possible to bring the reflection position on the outer face 14a of the optical coupling portion 14 closer to the optical semiconductor element 1 and the optical transmission path 2 and thus shorten the optical transmission path in the optical coupling portion 14 as shown in FIG. 7. As a result, it is possible to construct a stable optical connection without increasing the connection loss.

The case of the optical semiconductor element 1 being a light emitting element, in which the light 10 emitted from the light receiving/emitting portion 1a of the optical semiconductor element 1 is reflected at the outer face 14a of the optical coupling portion 14 and is incident on the optical transmission path 2 is also the same.

Generally, when optical path length becomes long, the optical connection loss tends to increase. This is because, as shown in FIG. 7, when light is emitted from the optical transmission path 2 (or the light receiving/emitting portion 1a), it has a spread angle of a certain degree, and thus travels while spreading inside the optical coupling portion 14.

Figure 8:
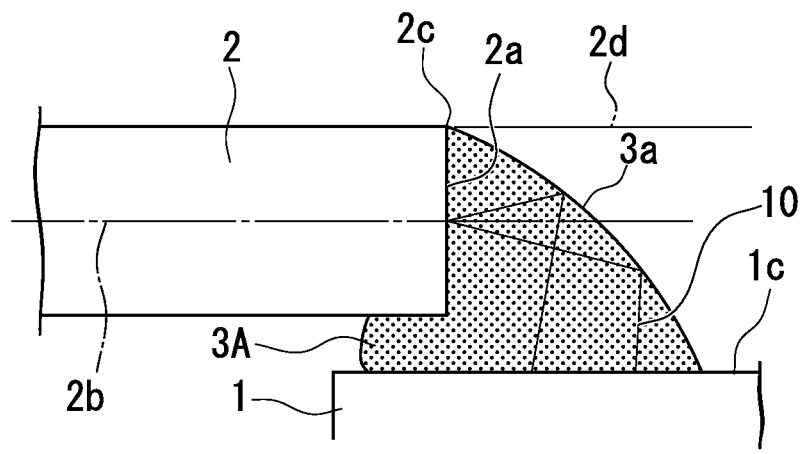
FIG. 8 is a cross-sectional view that describes the case of the outer face of the optical coupling portion having a convex shape in the optical coupling structure according to one embodiment of the present invention.

As shown in FIG. 8, when the outer face 3a of the optical coupling portion 3 has a convex shape, the position where the light 10 is reflected by the outer face 3a of the optical coupling portion 3 becomes farther, and the optical path length within the optical coupling portion 3 becomes longer. Therefore, especially in the case of light with a large spread angle being emitted, the light may diffuse, and the thus connection loss may increase.

Figure 9:
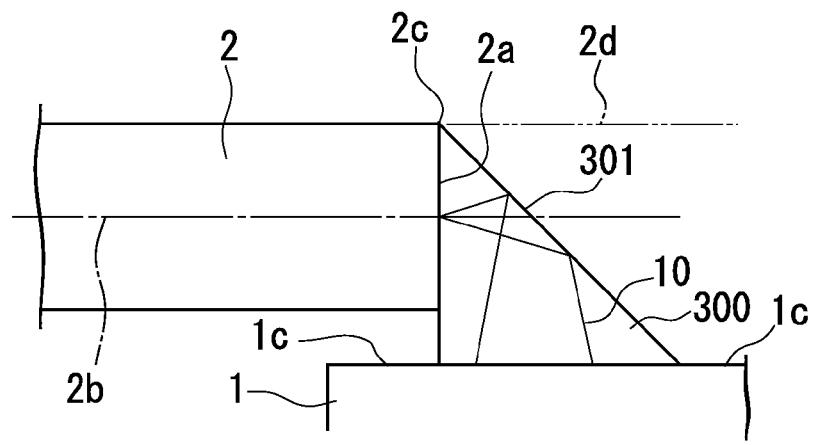
FIG. 9 is a cross-sectional view that describes the case of the optical coupling portion being a 45° mirror.

As shown in FIG. 9, in the case of forming a resin 300 so as to function as a 45° mirror, due to the position of the reflection plane 301 being far, and the optical path being long, the light 10 spreads out, and the connection loss ends up increasing.

Figure 10:
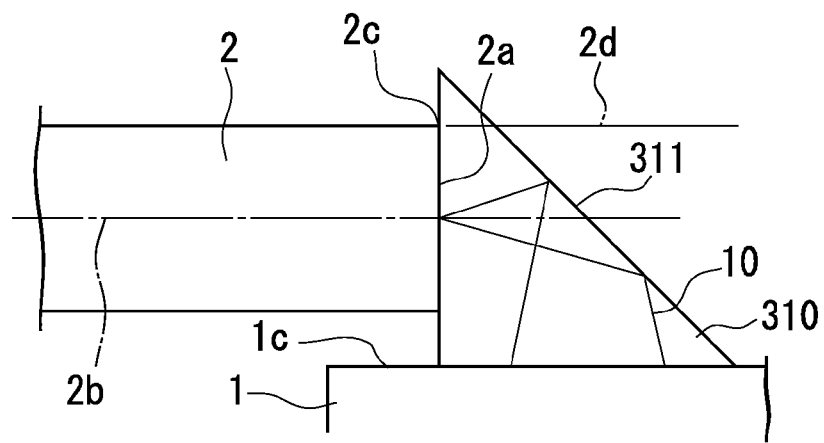
FIG. 10 is a cross-sectional view that describes the case of the optical coupling portion being a large 45° mirror.

As shown in FIG. 10, when a resin 310 that serves as a 45° mirror is large and exceeds the height 2d of the upper end 2c of the end face 2a of the optical transmission path 2, the distance from the end face 2a to the reflection plane 311 and the optical path of the light 10 become still longer.

Among the concave portions 11 to 13 shown in FIG. 2A, since the section that is close to the light receiving/emitting portion 1a of the optical semiconductor element 1 and the end portion 2a of the optical transmission path 2 optically couples the optical semiconductor element 1 and the optical transmission path 2 due to the reflection at the interface 14a of the transparent resin, the range of the light spreading becomes narrow, and it is possible to reduce the loss. For that reason, it is preferable that, in the optical coupling portion 14, no resin be present at the position of the intersection point P where the optical axis 1b of the optical semiconductor element 1 and the optical axis 2b of the optical transmission path 2 intersect, the position A where the outer face 14a of the resin faces the light receiving/emitting portion 1a be between the intersection point P and the light receiving/emitting portion 1a, and the position B where the outer face 14a of the resin faces the end portion 2a of the optical transmission path 2 be between the intersection point P and the end portion 2a of the optical transmission path 2.

Figure 11:
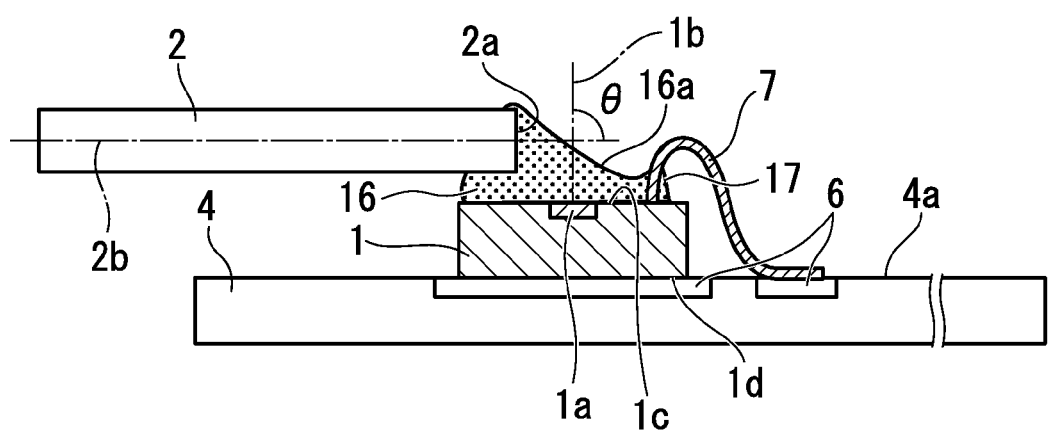
FIG. 11 is a cross-sectional view that describes the case of the resin of the optical coupling portion making contact with the wire that is wire-bonded to the upper face of the optical semiconductor element.

As shown in FIG. 11, when the optical coupling portion 16 conies into contact with the power supply wiring 7, the shape of the optical coupling portion 16 disintegrates around the portion 17 at which the resin is attached to the power supply wiring 7 (attachment portion). In this case, since the position where light is reflected by the outer face 16a of the optical coupling portion 16 becomes far from the optical transmission path 2 and the optical semiconductor element 1, the optical path length in the optical coupling portion 16 becomes long. Thereby, the light diffuses, the connection loss increases, and a shape that attains a high coupling efficiency is difficult to fabricate. That is to say, an excellent coupling efficiency cannot be obtained. In addition, the shape is extremely unstable, and large variations in manufacturing occur. For this reason, even if the power supply wiring 7 is close to the optical transmission path 2, it is extremely important in terms of their characteristics and manufacture that the optical coupling portions 3 and 14 do not rest on the power supply wiring 7.

In the same manner, if the optical coupling portion is not arranged within the upper face 1c of the optical semiconductor element 1 when viewed from above, the resin that forms the optical coupling portion easily spreads when manufacturing the optical coupling portion, and the position in which light is reflected by the outer face of the optical coupling portion tends to be far. As a result, because of the optical path length within the optical coupling portion becoming long, the light disperses, and the connection loss easily increases. Moreover, since it is hard to stabilize the spread of the resin, large variations in manufacture occur.

As for the optical coupling portions 3 and 14 of the present embodiment, the periphery of the transparent resin is surrounded by gas. Since the refractive index difference between the transparent resin and the gas is large, it is possible to increase the reflectance of light at the interface. Thereby, it is possible to further improve the coupling efficiency of light.

That is to say, in the optical coupling portions 3 and 14 of the present embodiment, since the optical coupling portions 3 and 14 are arranged within the upper face 1c of the optical semiconductor element 1, the optical coupling portions 3 and 14 do not make contact with the power supply wiring 7 that is wire-bonded to the upper face of the optical semiconductor element 1, and the periphery of the optical coupling portions 3 and 14 are surrounded with a gas, and more preferably the outer face 14a of the optical coupling portion 14 has a concave shape, in addition to the fact that the optical semiconductor element 1 and the optical transmission path 2 are connected (integrated) by the resin itself that constitutes the optical coupling portions 3 and 14, it is possible to reliably achieve a high-efficiency optical coupling with a lower manufacturing accuracy regarding the shape of the interface of the transparent resin even if the position and angle of the reflection plane are not precisely controlled.

In the present embodiment, since it is possible to mount the optical semiconductor element 1 on the mounting face 4a of a substrate 4 so that the light receiving/emitting portion 1a faces the opposite side (the upper side in FIGS. 1A-1C) of the mounting face 4a of the substrate 4, mounting by die bonding or wire bonding can be performed. Thereby, it is possible to connect the wiring, which is important for transmission characteristics, in the shortest line length and thus excellent transmission characteristics are obtained with preventing noise. Further, appearance inspection of the bonding can be easily performed, and thus it becomes easy to discover poor connections.

What follows is a description of the manufacturing method of the optical module of the present invention. The method of manufacturing the optical modules 5 and 15 having the configuration shown in the aforementioned FIGS. 1A to 2C will be illustrated.

As shown in FIG. 3, a circuit wiring 6 is formed in advance on the mounting surface 4a, and the substrate 4 is prepared on which the optical semiconductor element 1 is mounted. Then, using a resin dip device 29 such as a precision dispenser, an uncured transparent resin 31 is applied on the light receiving/emitting portion 1a of the optical semiconductor element 1.

It is desirable for the transparent resin 31 to be applied within a range limited to the upper face 1c of the optical semiconductor element 1. At this time, the transparent resin 31 is applied separately from the power supply wiring so that the transparent resin 31 may not come into contact with the power supply wiring 7.

Then, as shown in FIG. 4, the end portion 2a of the optical transmission path 2 is, with respect to the optical semiconductor element 1, inserted into the transparent resin 31 (in the direction of the arrow L) that is piled up on the optical semiconductor element 1.

The optical transmission path 2 that has been inserted into the transparent resin 31 is moved away from the optical semiconductor element 1. At this time, the optical transmission path 2 is slowly pulled up in an upward oblique direction from the optical semiconductor element 1 (the direction of the arrow R).

Then, in accordance with the type of transparent resin 31, irradiation with for example UV (ultraviolet rays) and heat is performed if needed, to cure the transparent resin 31. Thereby the optical coupling portions 3 and 14 that optically connect (optically couple) the optical semiconductor element 1 and the optical transmission path 2 are formed, and the optical modules 5 and 15 are completed.

The shape of the transparent resin 31 after pulling up the optical transmission path 2 in an oblique direction in FIG. 4 is determined by (1) the interfacial tension between the transparent resin 31 and the optical semiconductor element 1, (2) the interfacial tension between the transparent resin 31 and the optical transmission path 2, and (3) the surface tension between the transparent resin 31 and the outside gas. That is to say, it depends on mounting conditions such as (A) the optical semiconductor element 1, the optical transmission path 2, and the transparent resin 31, (B) the states of the members such as the surface state of the optical semiconductor element 1 and the optical transmission path 2, and the viscosity of the transparent resin 31, and (C) the amount of the applied transparent resin 31 in FIG. 3 and the insertion amount and the pull-up amount of the optical transmission path 2 in FIG. 4. If these conditions (A), (B), and (C) are the same, naturally the shape of the transparent resin 31 will be constant. It can also be controlled by those conditions such as whether the outer faces 3a and 14a of the optical coupling portions 3 and 14 have a concave shape or a convex shape, or whether the optical coupling portions 3 and 14, when viewed from above, have a circular shape or an elliptical shape, or whether they have a fan shape.

With regard to the pull-up amount of the optical transmission path 2 in the R direction, an optimum value exists in accordance with the structure of the optical transmission path 2 and the optical semiconductor element 1 to be used, and the coating amount of the transparent resin 31. If such an optimum value is investigated in advance, it becomes possible to automate all the production steps mentioned above, and further labor-saving in the production steps can be realized. Moreover, when producing the optical coupling portion 3 and 14, it is not necessary to transmit light between the optical semiconductor element 1 and the optical transmission path 2, and so passive alignment is possible. Even if the position of the passive alignment shifts from the optimal position somewhat due to a change in the application quantity of the resin or the like, since the optical semiconductor element 1 and the optical transmission paths 2 are connected by the transparent resin 31, the surface of the transparent resin 31 changes together with the optical transmission path 2. For that reason, the coupling efficiency of the optical coupling portions 3 and 14 can be suppressed, and the tolerance of alignment can be large. In active alignment that is performed while transmitting light, there is the risk of the resin curing during the alignment of the optical fiber when a photo-curable resin is used as the transparent resin 37, but in passive alignment, there is no risk of the resin curing during the alignment.

In this way, according to the method of manufacturing the optical module of the present embodiment, after applying the transparent resin 31 to the optical semiconductor element 1, inserting the optical transmission path 2 into the transparent resin 31 and pulling it up in an oblique direction, it is possible to form the optical coupling portions 3 and 14 that optically connect (optically couples) the optical semiconductor element 1 and the optical transmission path 2 just by curing the transparent resin 31. For this reason, when forming the optical coupling portions 3 and 14, it is not necessary to prepare a die for molding the resin, and so it becomes possible to manufacture an optical module with few steps or few component parts and at an extremely low cost.

It should be noted that the formation method of the optical coupling portions 3 and 14 is not limited to the method described above. For example, a process may be employed which includes arranging the distal end of the optical transmission path 2 above the optical semiconductor element 1, applying the transparent resin 31 so as to cover the distal end of the optical transmission path 2 and the light receiving/emitting portion 1a of the optical semiconductor element 1, pulling up the distal end of the optical transmission path 2 in the transparent resin 31 in an oblique direction, and then curing the transparent resin 31. That is to say, in order to pull up the distal end of the optical transmission path 2 in the transparent resin 31 in an oblique direction to form the optical coupling portions 3 and 14, the order of the step of arranging the distal end of the optical transmission path 2 on the optical semiconductor element 1, and the step of arranging the transparent resin 31 may be the reverse of the aforementioned method.

In this case, instead of the above-described condition (C), a condition (C'): "mounting conditions such as the applying amount of the transparent resin 31 and the position of the optical transmission path 2 before pulling up and the pull-up amount," is adopted, and if the conditions of (A), (B), and (C') are the same, the shape of the transparent resin 31 will naturally become constant. In addition, since there is the possibility of the optimal value of the pull-up amount in the R direction of the optical transmission path 2 changing if the order of the steps differs, it is desirable to investigate the optimal value by experimenting with the same steps as actually used.

Conventionally, in a sealed application such as an LED or the like, using the shape naturally decided by the properties of surface tension and interfacial tension as a convex lens or concave lens is publicly known. Patent Document 4 discloses a semiconductor laser device which is coated with transparent resin along the step of a substrate in order to cause the rear output light of the semiconductor laser element to be made incident on a monitor photo diode.

Since the manufacturing method of the optical module of the present embodiment does not require the adherence of transparent resin to a substrate, there is no need to add a machining step of the substrate 4 (a V-groove or a step) when forming the optical coupling portions 3 and 14. For this reason, the substrate is not limited to a substrate that can be used for anisotropic etching such as a silicon substrate, and even a substrate such as a glass-epoxy substrate with low resistance against machining step may be employed to produce the substrate at a low cost.

Figure 13:
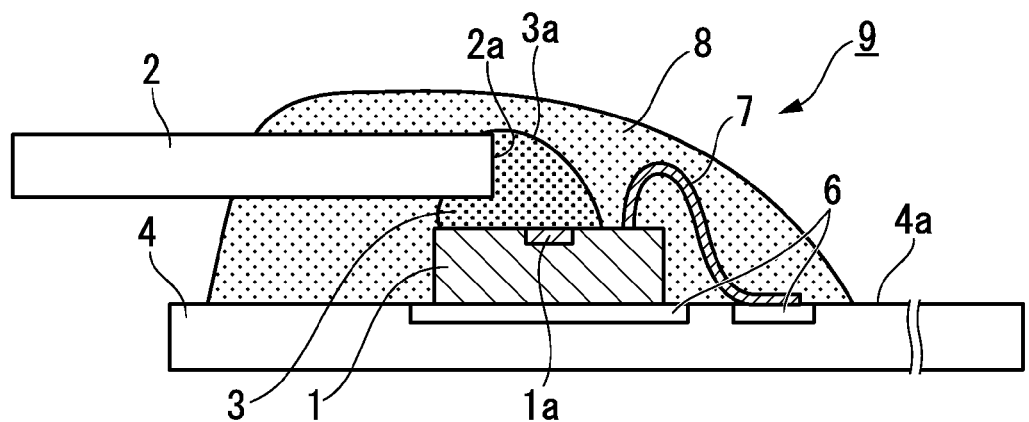
FIG. 13 is a cross-sectional view that shows an example of an optical module including the optical module structure according to the second embodiment of the present invention.
Figure 14:
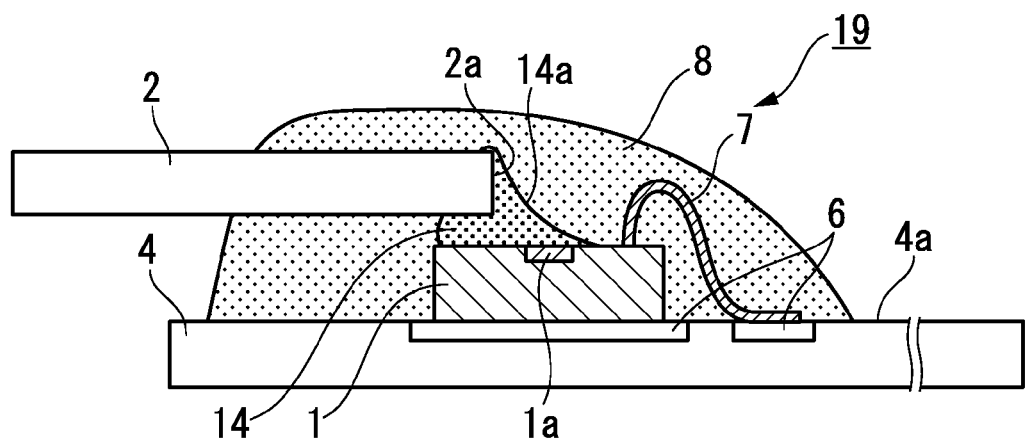
FIG. 14 is a cross-sectional view that shows an example of an optical module including the optical coupling structure according to the second embodiment of the present invention.

FIG. 13 and FIG. 14 show an example of an optical module that includes the optical coupling structure according to the second embodiment. The optical modules 9 and 19 that are shown in FIG. 13 and FIG. 14, respectively, include the optical semiconductor element 1 mounted on the mounting face 4a of the substrate 4, the optical transmission path 2 arranged separately from the mounting face 4a of the substrate 4, along the mounting face 4a of the substrate 4, the optical coupling portions 3 and 14 that optically couple the optical transmission path 2 and the optical semiconductor element 1, and a cladding resin layer 8 that covers the periphery of the optical coupling portions 3 and 14.

The optical modules 9 and 19 of present embodiment differ from the optical modules 5 and 15 according to the first embodiment in that the periphery of the optical coupling portions 3 and 14 is covered by the cladding resin layer 8 made of a second resin with a refractive index lower than the transparent resin (first resin) that constitutes the optical coupling portions 3 and 14. The optical semiconductor element 1, the optical transmission path 2, the substrate 4, the circuit wiring 6, and the wire interconnect 7 can be configured in the same way as in the optical modules 5 and 15 of the first embodiment.

Since the cladding resin layer 8 is formed by a resin with a refractive index lower than the transparent resin that constitutes the optical coupling portions 3 and 14, it is possible to inhibit light transmitted through the optical coupling portions 3 and 14 from entering the cladding resin layer 8 and scattering. Moreover, it is possible to seal the periphery of the cladding resin layer 8 with a resin (not illustrated) that has a higher refractive index than the optical coupling portions 3 and 14.

Refractive index here refers to the refractive index at the wavelength of light that is transmitted between the optical semiconductor element 1 and the optical transmission paths 2. It is possible to use a UV-curable resin or a thermosetting resin, for example, as the second resin. Specific examples of the second resin include an acrylic resin, an epoxy resin, and a silicon resin.

The cladding resin layer 8 is formed by applying and curing the second resin after forming the optical coupling portions 3 and 14 as shown in FIG. 3 and FIG. 4.

The optical coupling portions 3 and 14 of the present embodiment are the same as the first embodiment except that the optical coupling portions are covered with the cladding resin layer 8. FIG. 13 shows the case of the outer face 3a of the optical coupling portion 3 having a convex shape, and FIG. 14 shows the case of the outer face 14a of the optical coupling portion 14 having a concave shape.

Since the optical semiconductor element 1 and the optical transmission path 2 are connected (integrated) by the first resin itself that constitutes the optical coupling portions 3 and 14, it is possible for the first resin that constitutes the optical coupling portions 3 and 14 to easily and at low cost convert the optical path between the optical semiconductor element 1 and the optical transmission path 2, and optically couple the optical semiconductor element 1 and the optical transmission path 2 with high efficiency.

Since the first resin that constitutes the optical coupling portions 3 and 14 is arranged within the upper face 1c of the optical semiconductor element 1 when viewed from above, it is easy to control the spread of the first resin without using a die or the like, and is possible to manufacture it with an uniform shape of the optical coupling portions 3 and 14 made of the first resin.

Also, since the resin that constitutes the optical coupling portions 3 and 14 do not make contact with the power supply wiring 7 that is wire-bonded to the upper face of the optical semiconductor element 1, it is possible to manufacture it with few variations in the resin shape of the optical coupling portions 3 and 14 hindered from occurring.

Moreover, it is possible to shorten the optical path length of the optical coupling portions 3 and 14 due to the end face 2a of the optical transmission path 2 being arranged on the inside of the optical semiconductor element 1.

Further, it is preferable that the shape of the interface 14a between the optical coupling portion 14 and the cladding resin layer 8 have a concave shape, in the same manner as the optical coupling portion 14 of the first embodiment described above. Note that in the case of there being a need to arrange the optical transmission path 2 and the optical semiconductor element 1 separately from each other by a fixed distance or more, or in the case of the spread angle of the outgoing light being comparatively small, if the interface between the optical coupling portion and the cladding resin layer 8 has a convex shape in the same manner as the optical coupling portion 3 of the first embodiment mentioned above, the same effect is obtained as that obtained by the optical coupling portion 3 of the first embodiment.

The cladding resin layer 8 in the optical module 9 of the present embodiment functions as a cladding resin of the optical coupling portions 3, 14. In the case of the optical semiconductor element 1 being a light receiving element, light that has entered the optical coupling portions 3, 14 from the optical transmission path 2 is reflected at the interfaces 3a, 14a between the optical coupling portions 3, 14 and the cladding resin layer 8 due to the difference in refractive index, and enters the optical semiconductor element 1. In the case of the optical semiconductor element 1 being a light emitting element, the light that enters the optical coupling portions 3 and 14 from the optical semiconductor element 1 is reflected at the interfaces 3a, 14a between the optical coupling portions 3, 14 and the cladding resin layer 8 due to the difference in refractive index, and enters the optical transmission path 2.

Moreover, in the example shown in FIG. 13 and FIG. 14, the optical transmission path 2 is fixed to the mounting face 4a of the substrate 4 by the cladding resin layer 8. Thereby, the direction of the optical axis 2b does not easily move in the vicinity of the end portion 2a of the optical transmission path 2, and thus it is possible to inhibit a worsening of the optical coupling even if an external force acts on the optical transmission path 2.

Since the wire interconnect 7 is covered and protected by the cladding resin layer 8, it is possible to prevent the wire interconnect 7 (power supply wiring), which is easily damaged by external stress, from disconnecting.

Since the end portion 2a of the optical transmission path 2, the optical coupling portions 3, 14, and the optical semiconductor element 1 are covered with the cladding resin layer 8, these can be protected from external stress. That is to say, it is possible to increase the mechanical strength of the entire optical coupling structure including the optical semiconductor element 1 and the optical transmission path 2.

In this way, when the cladding resin layer 8 is provided so as to function as a protective layer of the wire interconnect 7, or a protective layer of the optical coupling structure, it is possible to easily form the cladding resin layer 8 to serve as these protective layers.

Figure 15:
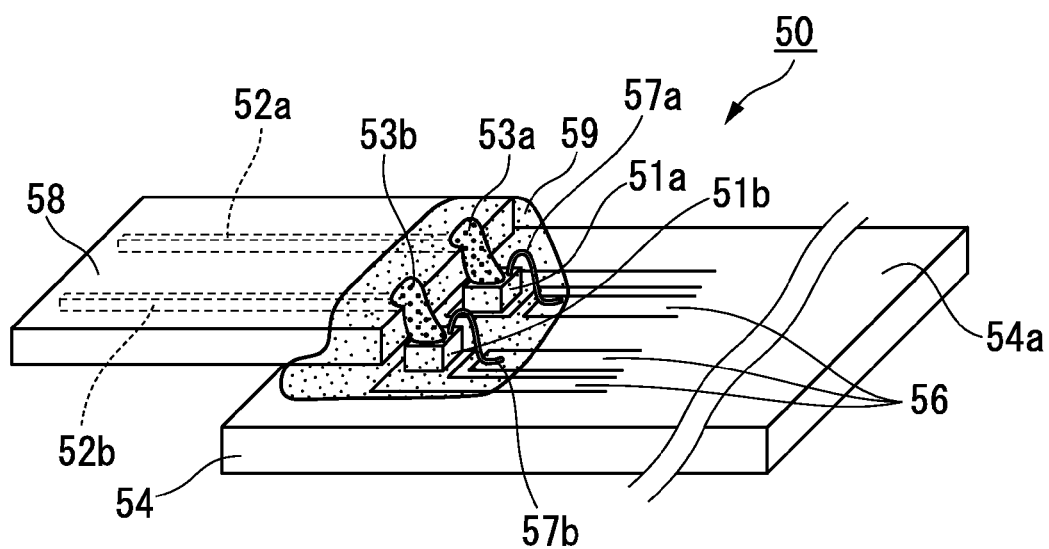
FIG. 15 is a perspective view that shows the optical transreceiver module according to an embodiment of the present invention.

FIG. 15 is a perspective view showing the optical transreceiver module according to an embodiment of the present invention. An optical transreceiver module 50 of the present embodiment includes a first optical semiconductor element 51a, which is a light receiving element, and a second optical semiconductor element 51b, which is a light emitting element, that are both mounted on a mounting face 54a of the same substrate 54, a first optical transmission path 52a and a second optical transmission path 52b that are arranged separately from the mounting face 54a of the substrate 54, a first optical coupling portion 53a that optically couples the first optical semiconductor element 51a and the first optical transmission path 52a, and a second optical coupling portion 53b that optically couples the second optical semiconductor element 51b and the second optical transmission path 52b.

The first optical semiconductor element 51a, the first optical transmission path 52a, and the first optical coupling portion 53a constitute first optical coupling structure, and the second optical semiconductor element 51b, the second optical transmission path 52b, and second optical coupling portion 53b constitute the second optical coupling structure.

In the case of the optical transreceiver module 50 of the present embodiment, the first optical coupling structure and the second optical coupling structure both constitute the same optical coupling structure as the optical modules 9 and 19 shown in FIGS. 13 and 14.

Specifically, the optical coupling portions 53a and 53b made of resin that is transparent to the light being transmitted, and a first resin respectively adheres to at least one portion of the light receiving/emitting portion of the optical semiconductor elements 51a and 51b, and at least one portion of the end portion of the optical transmission paths 52a and 52b, and so the optical semiconductor element 51a and the optical transmission path 52a are directly connected by the first resin itself that constitutes the optical coupling portion 53a, and the optical semiconductor element 51b and the optical transmission path 52b are directly connected by the first resin itself that constitutes the optical coupling portion 53b.

Further, it is preferable that the first resin that constitutes the optical coupling portions 53a and 53b be arranged within the upper face of the optical semiconductor elements 51a and 51b when viewed from above, that the resin that constitutes the optical coupling portions 53a and 53b not come into contact with the power supply wiring 57a and 57b that are wire-bonded to the upper face of the optical semiconductor elements 51a and 51b, and that the end face of the optical transmission paths 52a and 52b be present above the optical semiconductor elements 51a and 51b. In addition, the outer face of the optical coupling portions 53a and 53b (i.e., the interface with the cladding resin layer 59) may have a convex shape, and may have a concave shape. Note that in the drawings, the outer face of the optical coupling portions 53a and 53b has a concave shape. Moreover, it can be configured to omit the cladding resin layer 59 so that the periphery of the optical coupling portions 53a and 53b is surrounded by gas.

Thereby, even in the optical coupling from the first optical transmission path 52a to the first optical semiconductor element 51a which is a light receiving element, and even in the optical coupling from the second optical semiconductor element 51b that is a light emitting element to the second optical transmission path 52b, it is possible to manufacture an optical coupling structure at a low cost and with a simple process.

In the case of the optical transreceiver module 50 of present embodiment, the two optical semiconductor elements 51a and 51b are mounted in a row on the common substrate 54. These optical semiconductor elements 51a and 51b are respectively electrically connected by a joining material to a circuit wiring 56 that is formed on the substrate 54. For example, in the case of the present embodiment, the optical semiconductor elements 51a and 51b are electrically connected with the circuit wiring 56 with electrodes (not illustrated) that are formed on the upper portion (surface) of the optical semiconductor elements 51a and 51b and power supply wiring that includes the wiring interconnects 57a and 57b. The rear face of the optical semiconductor elements 51a and 51b and the circuit wiring 56 are electrically connected with a conductive adhesive (not illustrated). In the circuit wiring 56 and the wiring interconnects 57a and 57b, wiring that is connected to the light emitting element, and wiring that is connected to the light receiving element are independently provided.

In the case of the optical transreceiver module 50 of present embodiment, the first optical transmission path 52a and the second optical transmission path 52b are covered with a common covering material 58 in a unified manner. For this reason, in manufacturing the optical coupling portions 53a and 53b, when inserting the optical transmission paths 52a and 52b into the transparent resin (in the L direction) in the same manner as FIG. 4, and next when pulling up the optical transmission paths 52a and 52b in an oblique direction (R direction), by manipulating both optical transmission paths 52a and 52b at once, it is possible to simplify the operation.

As two or more optical transmission paths 52a and 52b that are integrated by the common covering material 58, it is possible to use an optical fiber tape core wire, a planar optical waveguide, and the like. The covering material 58 may be opaque to light transmitted through the optical transmission paths 52a and 52b.

The optical semiconductor elements 51a and 51b, the optical transmission paths 52a and 52b, and the optical coupling portions 53a and 53b may be covered with the single cladding resin layer 59.

Since the cladding resin layer 59 is formed of a resin with a refractive index that is lower than the transparent resin that constitutes the optical coupling portions 53a and 53b, it is possible to inhibit the light that is transmitted through the optical coupling portions 53a and 53b from entering the cladding resin layer 59 and scattering. Moreover, it is possible to seal the periphery of the cladding resin layer 59 with a resin (not shown) that has a higher refractive index than the optical coupling portions 53a and 53b.

In the case of the optical transreceiver module 50 of present embodiment, the optical transmission paths 52a and 52b that are integrated by the common covering material 58 are fixed to the mounting face 54a of a substrate 54 by the cladding resin layer 59. Thereby, the direction of the optical axis in the vicinity of the end portion of the optical transmission paths 52a and 52b is hindered from moving, and so even if an external force acts on the optical transmission paths 52a and 52b, deterioration of the optical coupling can be inhibited.

Moreover, since the wire interconnects 57a and 57b are covered and protected with the cladding resin layer 59, it is possible to prevent the wire interconnects 57a and 57b (power supply wiring), which are easily damaged by external stress, from disconnecting.

Since the end portion of the optical transmission paths 52a and 52b, the optical coupling portions 53a and 53b, and the optical semiconductor elements 51a and 51b are covered with the cladding resin layer 59, these can be protected from external stress. Accordingly, it is possible to increase the mechanical strength of the entire optical coupling structure.

Note that with the same structure as the optical transreceiver module 50 of FIG. 15, it is possible to constitute an optical transmitter module in which both of the optical semiconductor elements 51a and 51b are light emitting elements, and it is possible to constitute an optical receiver module in which both of the optical semiconductor elements 51a and 51b are light receiving elements.

It is also possible to have the cladding resin layer 59 cover only the periphery of some optical coupling portions, among the plurality of optical coupling portions 53a and 53b.

The number of the optical semiconductor elements mounted in an optical module is not limited to one or two, and may be three or more. The optical coupling structure of an optical semiconductor element and an optical transmission path can be provided in the required number in accordance with the number of optical semiconductor elements.

EXAMPLES

Hereinbelow, the present invention shall be explained in detail using Examples.

Example 1

As shown in FIGS. 1A to 4, as the optical transmission path 2, a silica based multi-mode optical fiber with a cladding diameter of 125 µm and a core diameter of 50 µm was prepared. For the optical semiconductor element 1, a PD (aperture diameter of the light receiving portion being 80 µm) was used as the light receiving element, a VCSEL (aperture diameter of the light emitting portion being 12 µm) was used as the light emitting element, a UV-curable resin (acrylic resin) is used for the transparent resin 31, a glass-epoxy substrate was used as the substrate 4, and a gold wire was used for the wire interconnect 7. After applying 2 nl (nanoliters) of the transparent resin 31 on the light receiving/emitting portion 1a (the light receiving portion of the PD or the light emitting portion of the VCSEL) of the optical semiconductor element 1, the distal end of the optical fiber was inserted into the transparent resin, and the optical fiber was pulled up a distance of 40 µm obliquely upward at an angle of 30°. Thereafter, by curing the transparent resin 31 by irradiating the transparent resin with UV light, the optical coupling structures 5 and 15 shown in FIGS. 1A to 2C were manufactured. The refractive index of the cured resin that constitutes the optical coupling portions 3 and 14 is 1.58.

As the transparent resin, 11 types of resin with different viscosities (A: 0.02 Pa·s, B: 0.1 Pa·s, C: 0.7 Pa·s, D: 1.5 Pa·s, E: 3.2 Pa·s, F: 5.5 Pa·s, G: 15 Pa·s, H: 21 Pa·s, I: 26 Pa·s, J: 35 Pa·s; K: 50 Pa·s) were used, and after forming the optical coupling portions, the shapes of these optical coupling portions were observed.

The period of time from after pulling up the optical fiber to the UV-light irradiation was determined for each transparent resin in order to obtain an excellent connection loss. Accordingly, the period of time differs in accordance with the transparent resins. The results are shown in Table 1.

TABLE 1

| | Sample Name | | | | | | | | | | |
|---|---|---|---|---|---|---|---|---|---|---|---|
| | A | B | C | D | E | F | G | H | I | J | K |
| Viscosity (Pa·s) | 0.02 | 0.1 | 0.7 | 1.5 | 3.2 | 5.5 | 15 | 21 | 26 | 35 | 50 |
| Range of Optical Coupling Portion | Viscosity is too low, so resin does not remain on element | | | | | | No contact with wire | | | | |
| Shape of Optical Coupling Portion | — | | | | | | | Concave shape | | | Convex shape |

In addition, optical modules were fabricated with the positional relationship between the optical transmission path and the optical semiconductor element optimized using the resins of Samples D, H, and K, and each connection loss was measured. The results are shown in Table 2. Note that in the optical coupling structure of each fabricated optical module, the aforementioned 30°<ϕ<60°, 30<x<60 µm and 0<y<20 µm are satisfied.

Moreover, the shape when viewing the optical coupling portion of each module from above is a fan shape as shown in FIG. 12C in the case of using Sample D, a fan shape as shown in FIG. 12C in the case of using Sample H, and an elliptical shape in the case of using Sample K.

TABLE 2

| Sample Name | | D | H | K |
|---|---|---|---|---|
| Range of Optical Coupling Portion | | No contact with wire | | |
| Shape of Optical Coupling Portion | | Concave shape | | Convex shape |
| Connection Loss (dB) | Light receiving element | 0.3 | 0.5 | 1.5 |
| | Light emitting element | 1.3 | 2.4 | 9.0 |

Example 2

Optical coupling portions were fabricated with the period of time from pulling up the optical diver to UV irradiation being constant, and the shape of each obtained optical coupling portion was observed. Table 3 shows the case of the period of time from pulling up the optical fiber to UV radiation being 3 seconds, and Table 4 shows the case of the time from pulling up the optical fiber to UV radiation being 2 minutes.

TABLE 3

Period of time from pulling up optical fiber to UV radiation: 3 seconds

| | Sample Name | | | | | | | | | | |
|---|---|---|---|---|---|---|---|---|---|---|---|
| | A | B | C | D | E | F | G | H | I | J | K |
| Viscosity (Pa·s) | 0.02 | 0.1 | 0.7 | 1.5 | 3.2 | 5.5 | 15 | 21 | 26 | 35 | 50 |
| Range of Optical Coupling Portion | Viscosity is too low, so resin does not | | | | | | No contact with wire | | | | |

TABLE 3-continued

Period of time from pulling up optical fiber to UV radiation: 3 seconds

| | Sample Name | | | | | | | | | | |
|---|---|---|---|---|---|---|---|---|---|---|---|
| | A | B | C | D | E | F | G | H | I | J | K |
| | | | remain on element | | | | | | | | |
| Shape of Optical Coupling Portion | | | — | | | | Concave shape | | | | Convex shape |

TABLE 4

Period of time from pulling up optical fiber to UV radiation: 2 minutes

| | Sample Name | | | | | | | | | | |
|---|---|---|---|---|---|---|---|---|---|---|---|
| | A | B | C | D | E | F | G | H | I | J | K |
| Viscosity (Pa · s) | 0.02 | 0.1 | 0.7 | 1.5 | 3.2 | 5.5 | 15 | 21 | 26 | 35 | 50 |
| Range of Optical Coupling Portion | Viscosity is too low, so resin does not remain on element | | | Contact with wire | | | No contact with wire | | | | |
| Shape of Optical Coupling Portion | — | | | | | | Concave shape | | | | Convex shape |

In addition, under those conditions, optical modules were fabricated with the positional relationship between the optical transmission path and the optical semiconductor element optimized using the resins of Samples D, H, and K, and the each connection loss was measured. Note that in the optical coupling structure of each fabricated optical module, the aforementioned 30°<φ<60°, 30<x<60 μm and 0<y<20 μm are satisfied.

Moreover, the shape when viewing the optical coupling portion of each module from above is a fan shape as shown in FIG. 12C in the case of using Sample D, a fan shape as shown in FIG. 12C in the case of using Sample H, and an elliptical shape in the case of using Sample K.

Table 5 shows the case of the period of time from pulling up the optical fiber to UV radiation being 3 seconds, and Table 6 shows the case of the period of time from pulling up the optical fiber to UV radiation being 2 minutes.

TABLE 5

| Sample Name | | D | H | K |
|---|---|---|---|---|
| Range of Optical Coupling Portion | | No contact with wire | | |
| Shape of Optical Coupling Portion | | Concave shape | | Convex shape |
| Connection Loss (dB) | Light receiving element | 0.3 | 0.9 | 1.5 |
| | Light emitting element | 1.3 | 3.8 | 9.4 |

Period of time from pulling up optical fiber to UV radiation: 3 seconds

TABLE 6

| Sample Name | | D | H | K |
|---|---|---|---|---|
| Range of Optical Coupling Portion | | Contact with wire | | No contact with wire |
| Shape of Optical Coupling Portion | | Concave shape | | Convex shape |
| Connection Loss (dB) | Light receiving element | 1.8 | 0.5 | 1.5 |
| | Light emitting element | 9.5 | 2.4 | 9.0 |

Period of time from pulling up optical fiber to UV radiation: 2 minutes

From the results of Table 2, Table 5, and Table 6, it was found that it is possible to manufacture an optical coupling portion at a low cost, and moreover possible to transmit an optical signal with a high efficiency due to the optical semiconductor element and the optical transmission path being bonded to each other with a resin that itself constitutes the optical coupling portion.

Moreover, in the case of the optical coupling portion not making contact with the wire, the connection loss is extremely small.

Further, in the case of the shape of the optical coupling portion having a concave shape, the connection loss is extremely small compared to the case of a convex shape.

According to the optical connection structure of the present invention, it is possible to manufacture an optical connection portion at a low cost without using a number of components, and moreover it is possible to transmit optical signals with higher efficiency.

What is claimed is:

1. An optical coupling structure comprising:
    an optical semiconductor element comprising a light receiving/emitting portion on an upper face thereof and being mounted on a substrate on a side of a lower face thereof;
    an optical fiber having an optical axis that intersects an optical axis of the optical semiconductor element at a predetermined angle and being arranged separately from a mounting face of the substrate; and
    an optical coupling portion configured to convert an optical path between the optical semiconductor element and an optical fiber and optically couple the optical semiconductor element and the optical fiber,
    wherein the optical coupling portion is made of a resin that is transparent with respect to a transmitted light, the resin adhering to both at least a portion of the light receiving/emitting portion of the optical semiconductor element and at least a portion of an end portion of the optical fiber;
    wherein the optical semiconductor element and the optical fiber are bonded to each other with the resin itself that constitutes the optical coupling portion;
    wherein an outer face of the resin that constitutes the optical coupling portion has a shape that is concave toward the light receiving/emitting portion of the optical semiconductor element and the end portion of the optical fiber;
    wherein the resin that constitutes the optical coupling portion is arranged so as not to include an intersection point where the optical axis of the optical semiconductor element and the optical axis of the optical fiber intersect;
    wherein a position at which the outer face of the resin faces the light receiving/emitting portion is between the intersection point and the light receiving/emitting portion, and a position at which the outer face of the resin faces the end portion of the optical fiber is between the intersection point and the end portion of the optical fiber; and
    wherein an angle formed between the upper face of the optical semiconductor element and a tangent of the outer face of the resin at a position where the optical axis of the optical semiconductor element and the outer face of the resin intersect is more than 0°.

2. The optical coupling structure according to claim 1, wherein the resin that constitutes the optical coupling portion is arranged only on the upper face of the optical semiconductor element.

3. The optical coupling structure according to claim 1, wherein the resin is arranged separately from a power supply wiring that is wire-bonded to the upper face of the optical semiconductor element.

4. The optical coupling structure according to claim 1, wherein an end face of the optical fiber is located on an inside of the optical semiconductor element and between end faces of the optical semiconductor element, when viewing the optical semiconductor element from a side and from above.

5. The optical coupling structure according to claim 1, wherein the resin that constitutes the optical coupling portion is arranged lower than a height of an upper end of an end face of the optical fiber.

6. The optical coupling structure according to claim 1, wherein the shape of the optical coupling portion, when viewing the optical coupling portion from above, is any one of a circular shape, an elliptical shape, or a circular sector.

7. The optical coupling structure according to claim 1, wherein a periphery of the optical coupling portion is covered with a gas.

8. The optical coupling structure according to claim 1, wherein a periphery of the optical coupling portion is covered with a cladding resin layer having a refractive index that is lower than a refractive index of the resin that constitutes the optical coupling portion.

9. The optical coupling structure according to claim 8, wherein a power supply wiring of the optical semiconductor element is covered with the cladding resin layer.

10. An optical transreceiver module comprising:
    a light receiving element and a light emitting element that are mounted on a mounting face of the same substrate;
    a first optical fiber and a second optical fiber that are arranged separately from the mounting face of the substrate;
    a first optical coupling portion that optically couples the light receiving element and the first optical fiber; and
    a second optical coupling portion that optically couples the light emitting element and the second optical fiber,
    wherein the light receiving element, the first optical fiber and the first optical coupling portion constitute a first optical coupling structure,
    wherein the light emitting element, the second optical fiber and the second optical coupling portion constitute a second optical coupling structure, and
    wherein one or both of the first optical coupling structure and the second optical coupling structure comprises the optical coupling structure according to claim 1.

11. A method of manufacturing an optical coupling structure according to claim 1, comprising:
    applying a resin to a light receiving/emitting portion of an optical semiconductor element that is provided on a substrate;
    inserting an optical fiber into the resin so as to be parallel to the substrate;
    moving the optical fiber in a direction away from the semiconductor element and obliquely upward;
    curing the resin into an optical coupling portion; and
    controlling the shape of the optical coupling portion such as to obtain a concave shape,
    wherein the controlling is performed according to a predetermined relationship between an amount of the applied resin, a viscosity of the resin, an insertion amount of the optical fiber, a movement amount obliquely upward of the optical fiber, and a time before curing the resin, and
    wherein the predetermined relationship is found before the controlling.

12. The method of manufacturing an optical coupling structure according to claim 11, wherein the resin is applied to the light receiving/emitting portion separately from a power supply wiring that is wire-bonded to the upper face of the optical semiconductor element.

* * * * *